United States Patent
Kikuchi

(10) Patent No.: US 8,610,312 B2
(45) Date of Patent: Dec. 17, 2013

(54) INDUCED POWER TRANSMISSION CIRCUIT

(76) Inventor: Hideo Kikuchi, Kanagawa (JP)

( * ) Notice: Subject to any disclaimer, the term of this patent is extended or adjusted under 35 U.S.C. 154(b) by 945 days.

(21) Appl. No.: 12/677,976

(22) PCT Filed: Sep. 15, 2008

(86) PCT No.: PCT/JP2008/002535
§ 371 (c)(1),
(2), (4) Date: Mar. 12, 2010

(87) PCT Pub. No.: WO2009/037821
PCT Pub. Date: Mar. 26, 2009

(65) Prior Publication Data
US 2010/0213770 A1 Aug. 26, 2010

(30) Foreign Application Priority Data

Sep. 17, 2007 (JP) ................. 2007-240331
Dec. 21, 2007 (JP) ................. 2007-329396
Jun. 15, 2008 (JP) ................. 2008-156060

(51) Int. Cl.
*H01F 37/00* (2006.01)

(52) U.S. Cl.
USPC .......................................... 307/104

(58) Field of Classification Search
USPC .......................................... 307/104
See application file for complete search history.

(56) References Cited

FOREIGN PATENT DOCUMENTS

| JP | 5-291991 A | 11/1993 |
|----|------------|---------|
| JP | 10-145987 A | 5/1998 |
| JP | 10-271050 A | 10/1998 |
| JP | 10-322247 A | 12/1998 |
| JP | 2001-238372 A | 8/2001 |
| JP | 2004-166384 A | 6/2004 |
| WO | 92/17929 A1 | 10/1992 |
| WO | 2004/073166 A2 | 8/2004 |

OTHER PUBLICATIONS

International Search Report for PCT/JP2008/002535.

*Primary Examiner* — Hal Kaplan
(74) *Attorney, Agent, or Firm* — Pearne & Gordon LLP

(57) ABSTRACT

To provide an induced power transmission circuit that transmits, from a transmission antenna (1) connected to a power supply circuit, an AC power having an angular frequency ω to a spaced reception antenna (2) with an excellent efficiency, thereby transmitting it to a load circuit. The induced power transmission circuit comprises a circuit the two ends of which are coupled by a capacitor (C1) and in which the power supply circuit is connected in series to a midway port (1) (P1) of the transmission antenna (1) having an effective self-inductance L1; and a circuit the two ends of which are coupled by a capacitor (C2) and in which the load circuit is connected in series to a midway port (2) (P2) of the reception antenna (2) having an effective self-inductance L2; wherein for a coupling coefficient k of the electromagnetic induction between the antennas and for a phase angle β having an arbitrary value, the angular frequency ω is set to the square root of the reciprocal of a value of $L2 \times C2 \times (1+k^*\cos(\beta))$, the output impedance of the power supply circuit is set to approximately $k\omega L1^*\sin(\beta)$, and the input impedance of the load circuit is set to approximately $k\omega L2^*\sin(\beta)$. There is also provided an impedance converting circuit that converts the circuit impedances.

12 Claims, 24 Drawing Sheets

Fig.15
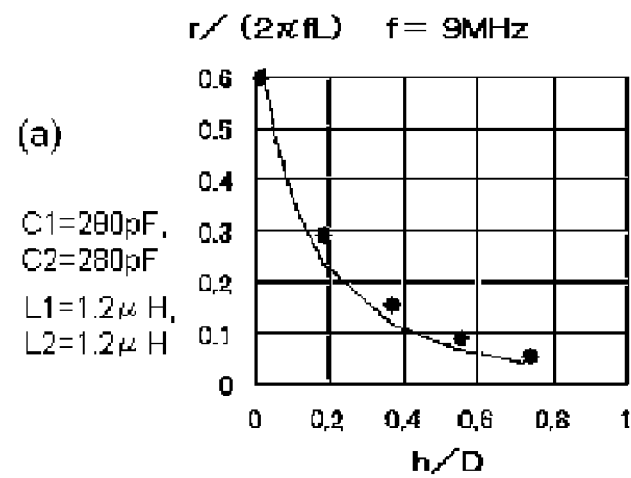
(a) C1=280pF, C2=280pF, L1=1.2μH, L2=1.2μH
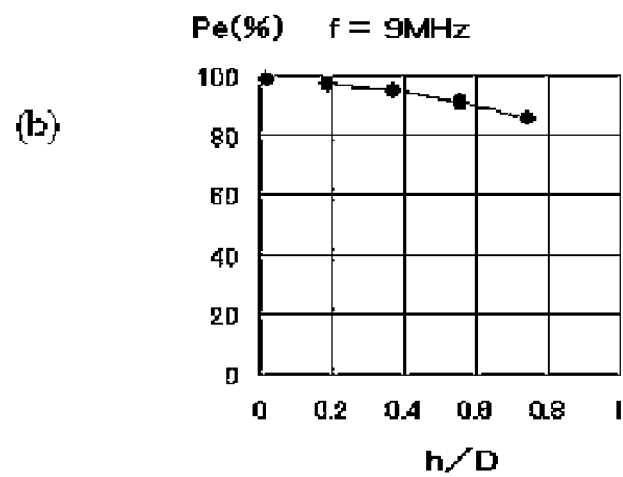
(b)

Fig20
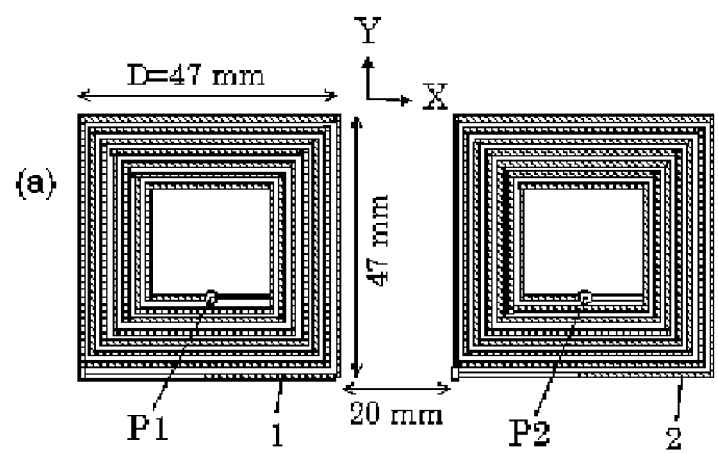
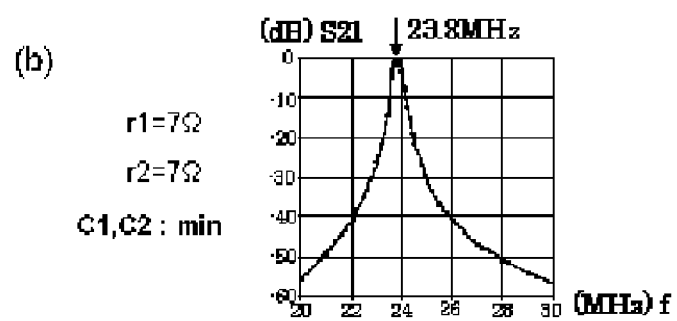

Fig.21
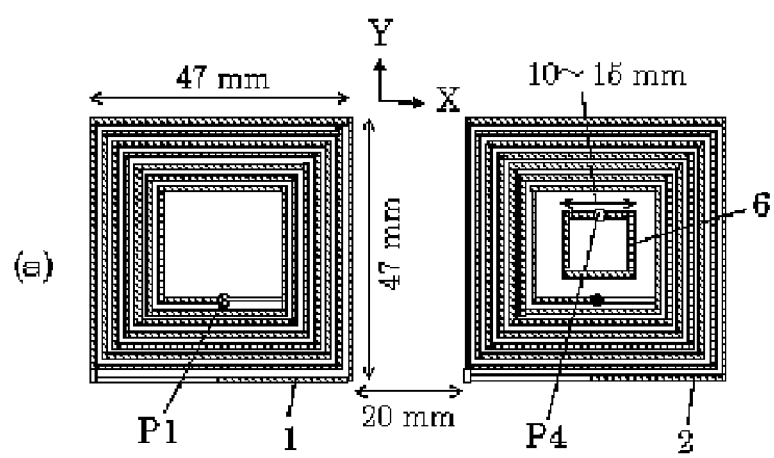
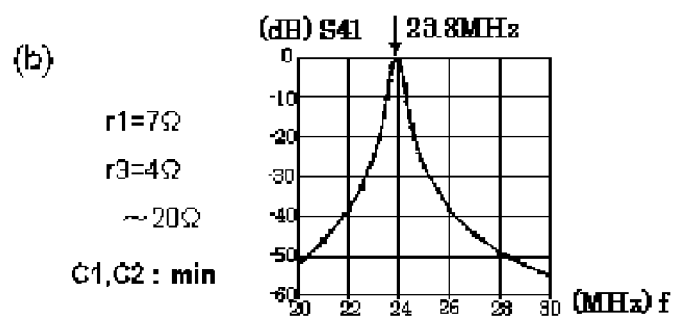
r1=7Ω
r3=4Ω
～20Ω
C1,C2 : min

Fig.22
(a) M=Mo
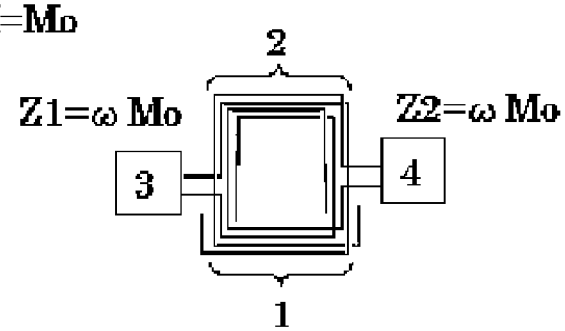
(b) M=Mo/γ
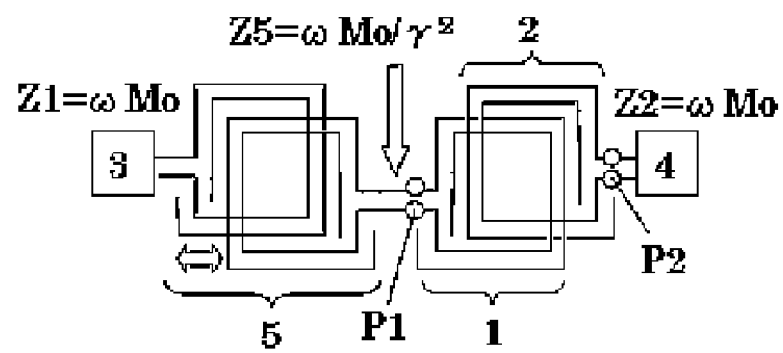

Fig.24
(a)
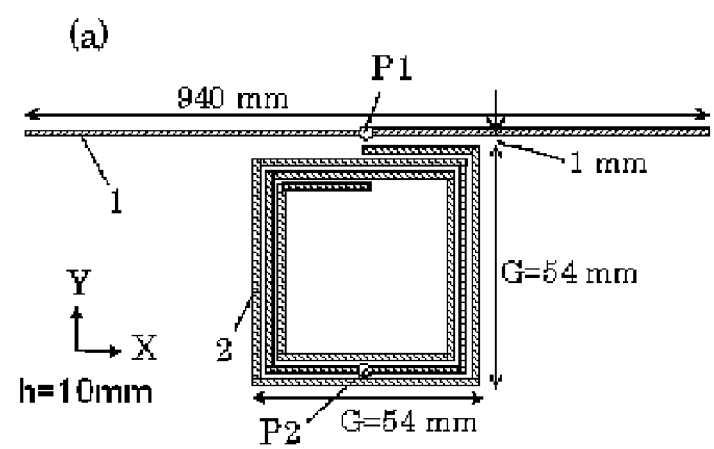
(b)
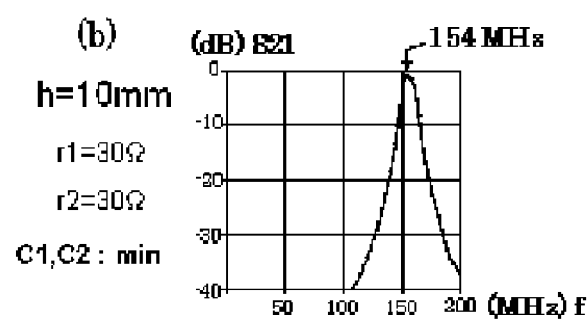

INDUCED POWER TRANSMISSION CIRCUIT

TECHNICAL FIELD

This invention concerns the inductive electric power transfer circuit in which the electric power is transferred through air space with wireless inducting means.

BACKGROUND

In patent document 1, an inductive electric power transfer circuit for an electric vehicle is proposed. That transfers electric power from a primary winding of a power supply facility to a secondary winding of a powered device of an electrical vehicle. Since it has no contact points, the inductive electric power transfer circuit has an advantage that is free from lose contact problems for electric terminals. The inductive electric power transfer circuit transfers power by electromagnetic induction on the secondary winding of the powered device with electromagnetic field generated by current on the primary winding of the power supply facility. A capacitor is connected between both ends of the secondary winding, and a resonant circuit is constructed with the secondary winding and the capacitor. The resonance of the resonant circuit strengthens the power received by the secondary winding. The power is transferred to the powered device which is connected to the resonant circuit in parallel. Some applications of this kind of inductive electric power transfer circuit that transfers electric power through space are toothbrushes, cellular phones, etc. The circuit according to patent document 1 keeps distance constant between the primary winding and the second winding of the powered device, and the powered devices such as toothbrushes or cellular phones are held at fixed positions in their holders to receive electric power. However, there is a deficiency that their power transfer efficiency according to patent document 1 becomes low when the distance between the primary winding and the secondary winding is enlarged, then mutual inductances M between the primary winding and the secondary winding becomes smaller than that in closed coupled mutual inductive circuits.

Patent document 2 provides a circuit that transfers electric power from a reader/writer, which is a power supply device with a primary winding, to an IC card, which is a powered device (remote device) with a secondary winding, on condition that distance between the primary winding and the secondary winding, which is far from the primary winding, changes. A capacitor is connected between both ends of the secondary winding of the powered device. The capacitor and inductance of the secondary winding construct a resonant circuit to increase electric power received. The power supply device is composed of a power supply circuit, a matching circuit, and a primary winding to adapt change of power transferred from the power supply device to the remote device when distance between the primary winding and the secondary winding changes. The remote device of IC card has a variable impedance circuit which is connected in parallel with the resonant circuit that is composed of the capacitance and the secondary winding. The resonant circuit is connected with a rectifier circuit, which is connected with a load circuit of IC chip. The variable impedance is adjusted to stabilize voltage on the load circuit by detecting the voltage. The power supplied to the load circuit is stabilized by this circuit, but there is a problem that the electric power supplied from the power supply circuit is uselessly consumed yielding low power transfer efficiency.

Patent document 3 provides a circuit which has improved power transfer efficiency from a reader/writer to an IC card by using a impedance varying means which varies two variable circuit elements, such as two variable capacitors, or as a variable capacitor and a variable inductance, by sensing power transfer efficiency with a sensing means.

Patent document 4 provides a circuit which has improved power transfer efficiency across wide space from a power supply facility to a remote device. The power supply facility adjusts supply of power according to information sent from the remote device that reports received power. That is, the electric power was supplied from the power supply to the remote device with high power transfer efficiency by varying two variable parameters of two circuit elements, capacitor and inductor in the power supply.

Patent document 1: WO92/017929
Patent document 2: JP10-145987
Patent document 3: JP2001-238372
Patent document 4: WO04/073166

DISCLOSURE OF THE INVENTION

Problems that the Invention Tries to Solve

In patent documents 2, 3, and 4, transfer efficiencies of electric power from the primary windings to the secondary windings are improved using resonance of a resonant circuit composed of inductance of the secondary winding and a capacitor connected between both ends of the secondary winding of the remote device, adapting to the change of distance between the primary winding and the secondary winding. A load circuit is connected in parallel to the capacitor, which is between both ends of the secondary winding, to receive electric power. Patent document 3 provides technology that adapts impedance of the resonant circuit by varying two parameters of elements in the circuit in order to transfer constant electric power efficiently from a reader/writer to an IC card. However, it is not shown in patent document 3 how to vary the two circuit element parameters in order to keep good power transfer efficiency when the distance from the reader and/or writer device to IC card is changed. It is necessary to adjust them by trial and error. In patent document 4 also two parameters of elements in circuit, which are a capacitance and an inductance of a power supply, is adjusted by trial and error.

The first object of the present invention is to obtain the inductive electric power transfer circuit that transfers electric power efficiently from the transmitter antenna, which is connected with a power supply circuit that supplies electric power, across air space to the receiver antenna, which is connected with a load circuit that consumes the electric power, and adjusts parameters of elements in the circuit without trial and error.

Circuits according to patent documents 3 and 4 have the following problems. That is, when the distance from the primary winding to the secondary winding changes, two parameters, circuit elements, should be adjusted at the same time to match the impedances of the circuits in order to adapt the change and keep high efficiency of electric power transmission. Setting both parameters of the two elements in the circuits properly at the same time is not easy, or impedances of the circuits will not match. Therefore, it is the second object of the present invention to obtain the inductive electric power transfer circuit in which the electric power can be transferred efficiently from the power supply circuit to the load circuit through space by adjusting only one parameter of element in circuit.

Means for Solving the Problems

Researching for solution of this problem, it was found that the electric power can be efficiently transferred by reducing impedances of the power supply circuit and the load circuit to certain specific resistances (induced resistances) on antennas. The induced resistance is calculated by dividing voltage that is induced on the antenna by the antenna current. So the circuit according to the present invention can transfer electric power efficiently with matching the impedances of the power supply circuit and the load circuit with the induced resistances on the antennas connected to them.

That is, an aspect of the present invention is an inductive electric power transfer circuit that transfers electric power with angular frequency ω from a transmitter antenna connected to a power supply circuit to a receiver antenna connected to a load circuit through space. The circuit has a capacitance C1 connected between both ends of the transmitter antenna, whose effective self-inductance is represented by the symbol L1. The circuit has a capacitance C2 connected between both ends of the receiver antenna, whose effective self-inductance is represented by the symbol L2. The power supply circuit is connected in series in the middle of the transmitter antenna. The load circuit is connected in serried in the middle of the receiver antenna. Distance between the transmitter antenna and the receiver antenna is not greater than $1/2\pi$ wavelengths of electromagnetic field that carry electric power. A coefficient of coupling between the transmitter antenna and the receiver antenna is represented by the symbol k. The angular frequency ω is set to reciprocal of square root of $L2 \times C2 \times (1+k \times \cos(6))$ on phase angle β that is more than zero radians and less than π radians. Output impedance of the power supply circuit is matched to $k\omega L1 \cdot \sin(\beta)$ r1, and input impedance of the load circuit is matched to $k\omega L2 \cdot \sin(\beta)$ r2, so that power is transferred efficiently from the power supply circuit to the load circuit.

The effective self-inductances of the antennas in the inductive-electric-power-transfer-circuit according to the present invention change according to electric current distribution on the antennas. Basic effective self-inductance among them is the self-inductance L that has electric current with uniform distribution on the antenna. Coefficient of coupling k can be calculated, or obtained from electromagnetic field simulation as follows. That is, coefficient of coupling k is obtained as $k=r/(\omega L)$, where the induced resistance r is obtained from simulation of the third type resonance of the principle of the present invention. The coefficient of coupling k is independent from electric current distribution of antenna and is almost constant. Effective self-inductance L of the antenna that has electric current with non-uniform distribution can be calculated as $L=r/(\omega k)$, where the coefficient of coupling k is obtained previously. The capacitance C, which is total capacitance including parasitic capacitance, can be calculated as $1/\omega^2 L$). The angular frequency ω of the resonance shifts from $1/\sqrt{(L2 \times C2)}$ to $1/\sqrt{\{L2 \times C2 \times (1+k \times \cos(\beta))\}}$ in the second type resonance of the principle of the present invention. The induced resistance r1 appears on the transmitter antenna as $k\omega L1 \times \sin(\beta)$; and the induced resistance r2 appears on the receiver antenna as $k\omega L2 \times \sin(\beta)$. Electric power can be transferred efficiently by matching impedances of the power supply circuit and the load circuit with the induced resistances appeared on the antennas connected to them.

An aspect in accordance with the present invention provides an inductive electric power transfer circuit, wherein the combination of the power supply circuit and the transmitter antenna is replaced with a combination of a transmitter antenna, a first inductive coupling wiring that inductively couples with the transmitter antenna with mutual inductance M1, a second power supply circuit that is connected between both ends of the first inductive coupling wiring. Output impedance of the second power supply circuit is set to almost $(2\pi f \times M1)^2/r1$.

An aspect in accordance with the present invention provides an inductive electric power transfer circuit; wherein the combination of circuits of the load circuit and the receiver antenna is replaced with a combination of a receiver antenna, a second inductive coupling wiring that inductively couples with the receiver antenna with mutual inductance M2, a second load circuit that is connected between both ends of the second inductive coupling wiring. Input impedance of the second load circuit is almost $(2\pi f \times M2)^2/r2$.

That is, as shown in FIG. 21, the inductive electric power transfer circuit according to the present invention has an inductive coupling wiring 6 that inductively couples with the receiver antenna 2, and has a load circuit that is connected between both ends of the inductive coupling wiring 6 at port 4 (P4). Input impedance of the load circuit is set to almost $(2\pi f \times M2)^2/r2$, where r2 is induced resistance on the receiver antenna 2. On the other hand, present invention provides an inductive electric power transfer circuit which has an inductive coupling wire 6 that is connected to the power supply circuit and is inductively coupled with the transmitter antenna. An output impedance of the power supply circuit is set to almost $(2\pi f \times M1)^2/r1$.

An aspect in accordance with the present invention provides an inductive electric power transfer circuit; wherein the combination of the power supply circuit and the transmitter antenna and the capacitance C1 is replaced with an antenna that receives electromagnetic wave from the air.

An aspect in accordance with the present invention provides an inductive electric power transfer circuit; wherein the combination of circuits of the load circuit and the receiver antenna and the capacitance C2 is replaced with an antenna that radiates electromagnetic wave into the air.

An aspect in accordance with the present invention provides an inductive electric power transfer circuit; wherein the transmitter antenna combines with a first inductive coupling wiring. And output impedance of the second power supply circuit is set to almost $(2\pi f \times L1)^2/r1$.

An aspect in accordance with the present invention provides an inductive electric power transfer circuit; wherein the receiver antenna combines with a second inductive coupling wiring concurrently. And input impedance of the second load circuit is set to almost $(2\pi f \times L2)^2/r2$.

An aspect in accordance with the present invention provides an inductive electric power transfer circuit that transfers electric power with angular frequency ω from a transmitter antenna connected to a power supply circuit to a receiver antenna connected to a load circuit through space. The circuit has a capacitance C1 connected between both ends of the transmitter antenna, whose effective self-inductance is represented by the symbol L1. The circuit has a capacitance C2 connected between both ends of the receiver antenna, whose effective self-inductance is represented by the symbol L2. The power supply circuit is connected in series in the middle of the transmitter antenna. The load circuit is connected in serried in the middle of the receiver antenna. Distance between the transmitter antenna and the receiver antenna is not greater than $1/2\pi$ wavelengths of electromagnetic field that carry electric power. Mutual inductance between the transmitter antenna and the receiver antenna is represented by the symbol M. The angular frequency ω is set to reciprocal of square root of $L2 \times C2$. Input impedance of the load circuit is set to $(\omega M)^2/Z1$, where Z1 represents output impedance of the power supply circuit.

That is, the inductive electric power transfer circuit according to the first type resonance of the present invention with angular frequency ω of $1/\sqrt{(L2 \times C2)}$ converts the output impedance Z1 to the input impedance $Z2=(\omega M)^2/Z1$.

An aspect in accordance with the present invention provides an inductive electric power transfer circuit; wherein the combination of the power supply circuit and the transmitter antenna is replaced with a combination of a transmitter antenna, a first inductive coupling wiring that inductively couples with the transmitter antenna with mutual inductance M1, a second power supply circuit that is connected between both ends of the first inductive coupling wiring. Input impedance of the load circuit is set to almost $(M1/M1)^2 Z3$, where Z3 represents output impedance of the second power supply circuit.

An aspect in accordance with the present invention provides an inductive electric power transfer circuit; wherein the combination of circuits of the load circuit and the receiver antenna is replaced with a combination of a receiver antenna, a second inductive coupling wiring that inductively couples with the receiver antenna with mutual inductance M2, a second load circuit that is connected between both ends of the second inductive coupling wiring. Input impedance of the second load circuit is almost $(M2/M1)^2 Z1$, where Z1 represents output impedance of the power supply circuit.

An aspect in accordance with the present invention provides an inductive electric power transfer circuit; wherein the transmitter antenna combines with a first inductive coupling wiring. And input impedance of the load circuit is set to almost $(M/L1)^2 Z3$, where Z3 represents output impedance of the second power supply circuit.

An aspect in accordance with the present invention provides an inductive electric power transfer circuit; wherein the receiver antenna combines with a second inductive coupling wiring concurrently. And input impedance of the second load circuit is set to almost $(L2/M)^2 Z1$, where Z1 represents output impedance of the power supply circuit.

Effects of the Invention

The inductive electric power transfer circuit according to present invention transfers electric power at the angular frequency ω from the transmitter antenna, which is connected to the power supply circuit, to the receiver antenna through space. Power is transferred efficiently from the power supply circuit to the load circuit by decreasing the impedances of the power supply circuit and the load circuit to match the induced resistances on the antennas. The induced resistances are easily calculated according to present invention. The inductive electric power transfer circuit transfers power in full efficiency from the power supply circuit to the load circuit. Moreover, an impedance converter that freely converts impedances can be constructed with air-core coil.

BRIEF DESCRIPTION OF THE DRAWINGS

FIG. 15(a) is a graph for induced resistance (r) as a function of spacing h between antennas according to the third embodiment of the present invention.

FIG. 15(b) is a graph for power transfer efficiency as a function of spacing h between antennas according to the third embodiment of the present invention.

FIG. 20(a) is a plan view and side view showing a transmitter antenna and a receiver antenna according to an eighth embodiment of the present invention.

FIG. 20(b) is a graph for S parameter (S21) of power transfer according to the eighth embodiment of the present invention.

FIG. 21(a) is a plan view and side view showing a transmitter antenna and a receiver antenna according to a ninth embodiment of the present invention.

FIG. 21(b) is a graph for S parameter (S21) of power transfer according to the ninth embodiment of the present invention.

FIG. 22(a) illustrates a plan view of a transmitter antenna and a receiver antenna according to present invention.

FIG. 22(b) illustrates a plan view of a transformer according to an eleventh embodiment of the present invention.

FIG. 24(a) is a plan view of a transmitter antenna and a receiver antenna according to a thirteenth embodiment of the present invention.

FIG. 24(b) is a graph for S parameter (S21) of power transfer according to the thirteenth embodiment of the present invention.

DESCRIPTION OF REFERENCE NUMERALS

Figure 1:
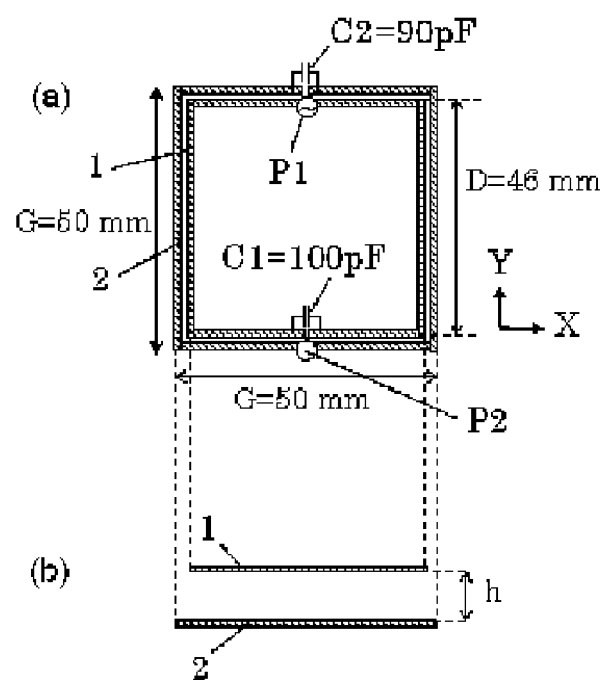
FIG. 1 is a plan view and side view showing the transmitter antenna and the receiver antenna of a first embodiment of the present invention.

1: Transmitter antenna
2: Receiver antenna
3: Power supply circuit
3a, 3b, 3c: Transmitter circuit
4: Load circuit
4a, 4b, 4c: Receiver circuit
5: Impedance converter
6: Inductive coupling wiring
C1, C2: Capacitance
d: Shifting distance
D, G: Coil diameter
f: Frequency
ω: Angular frequency
h: Antenna spacing
I1, I2: Antenna current
L, L1, L2: Effective self-inductance
M, Mo, M1, M2: Mutual inductance
min: Parasitic capacitance
Pe: Power transfer efficiency
P1: Port 1 (joining terminal)
P2: Port 2 (joining terminal)
P3: Port 3 (joining terminal)
P4: Port 4 (joining terminal)
P5: Port 5 (joining terminal)
P6: port 6 (joining terminal)
r, r1, r2, r3: Induced resistance
γ: Real number
X, Y: Axis of coordinate
Z1, Z2, Z3, Z4, Z5: Impedance

DESCRIPTION OF THE PREFERRED EMBODIMENTS

Principle of Present Invention

FIG. 1(a) shows the plan view (XY-plane) of a transmitter antenna 1 and a receiver antenna 2 of an inductive electric power transfer circuit according to present invention. And FIG. 1(b) shows the side view of them. The inductive electric power transfer circuit according to present invention has a resonance circuit which has the transmitter antenna 1 of coiled wiring, which has effective self-inductance L1, both ends of that are connected to a capacitance C1. A power supply circuit 3 is connected to port 1 (P1) in series, which is at the middle of the transmitter antenna 1. Similarly, the inductive electric power transfer circuit has a resonant circuit which has the receiver antenna 2 of coiled wiring, which has effective self-inductance L2, whose both ends are connected to a capacitance C2. And the load circuit 4 is connected to port 2 (P2) in series, which is at the middle of the receiver antenna 2. As shown in FIGS. 1(a) and 1b, both antennas that couple by electromagnetic induction are set within near-field region of ($1/2\pi$) wavelength of resonant electromagnetic field on the antennas. When both antennas are set within the near-field region, effect of interaction of the electromagnetic induction is greater than effect of radiation. Mutual inductance M between both antennas usually becomes below 60% of $\sqrt{(L1 \times L2)}$, which is mutual inductance of them in close coupling, when the transmitter antenna 1 and the receiver antenna 2 are separated.

In FIG. 1, the coiled wirings of the transmitter antenna 1 and the receiver antenna 2 are parallel in two levels that is parallel to XY-plane. The axes of the coiled wirings of the transmitter antenna 1 and the receiver antenna 2 are overlapped; and the antennas are set close in the direction of the axis. Placement of the antennas is not restricted to the case; they can be set in other placements where they are within the near-field distance that is ($1/2\pi$) wavelength of resonant electromagnetic field on the antennas. As shown in FIG. 20(a), the antennas can be set in coplanar. For each antenna, both ends of the antenna are connected to capacitance, and the shape of the antenna is one or several turned spiral or coiled wiring. The capacitances of C1 and C2, which connect both ends of the antennas, can be only parasitic capacitances without external capacitors between both ends of the antenna. Shape and size of the transmitter antenna 1 and the receiver antenna 2 are not necessarily the same.

Shapes of the transmitter antenna 1 and the receiver antenna 2 are not necessarily coils in FIG. 1. For instance, a dipole antenna for transmitter antenna 1 in FIG. 24(a) can resonate to transfer power in full efficiency Pe, which is defined by Equation 29 described hereinafter.

The inductive electric power transfer circuit according to present invention is modeled by the circuit in FIG. 2(a). The circuit has mutual inductance M between the transmitter antenna 1 that has effective self-inductance L1 and the receiver antenna 2 that has effective self-inductance L2. The inductive electric power transfer circuit supplies the power from the power supply circuit 3, which is connected to the transmitter antenna 1, to the load circuit 4, which is connected to the receiver antenna 2, through space. Capacitance C1, which is connected to both ends of the transmitter antenna 1, can be composed of a capacitor in the tank circuit in which power supply circuit 3 supplies electric current with angular frequency ω to the transmitter antenna 1. When the capacitance C1, which is connected to both ends of the antenna wiring, is greater than the parasitic capacitance, the position of the terminal of port 1 (P1), at which the power supply circuit 3 is connected in series, on the transmitter antenna 1 can be at a connecting point of one end of the antenna wiring and the capacitance C1. When the capacitance C2, which is connected to both ends of the antenna wiring, is greater than the parasitic capacitance, the position of the terminal of port 2 (P2), at which the load circuit 4 is connected in series, on the receiver antenna 2 can be at the point which connect one end of the antenna wiring and the capacitance C2.

The following were found as a result of research, and it provided present invention. When an inductive electric power transfer circuit is composed of the above-mentioned circuit structure, it is possible to resonate the receiver circuit 4a, which is a resonant circuit composed of the receiver antenna 2 and the capacitance C2, and the transmitter circuit 3a, which is a resonant circuit composed of the transmitter antenna 1 and the capacitance C1. When following requirements are fulfilled, the power can be transferred from the power supply circuit 3 to the load circuit 4 in full efficiency. The conditions in which power can be transferred efficiently are described as follows. At port 1 (P1) in FIG. 2(a), where the power supply circuit 3 connects to the transmitter antenna circuit 1, Voltage Ein is as following Equation 1.

$$Ein=j\{\omega L1-(1/(\omega C1))\}\times I1+j\omega M\times I2 \qquad \text{(Equation 1)}$$

where I1 is the antenna current on the transmitter antenna 1, I2 is the antenna current on the receiver antenna 2, $\omega=2\pi f$ is angular frequency, and f is the frequency of the currents. Following Equation 2 shows a function of input impedance Zin of the transmitter antenna circuit 1 seen from the power supply circuit 3 at port 1 (P1) in FIG. 2(a).

$$Ein=Zin\times I1 \qquad \text{(Equation 2)}$$

The last term ($j\omega M\times I2$) in the right side of Equation 1 is described as Equation 3 for an induced voltage E1 on the transmitter antenna 1; the voltage E1 is induced by changing electromagnetic field near the wiring of transmitter antenna 1, field which is caused by high-frequency current I2 on the receiver antenna 2.

$$E1=j\omega M\times I2 \qquad \text{(Equation 3)}$$

Equation 1, 2, and 3 yield the following Equations 4 for input impedance Zin of the antenna circuit.

$$Zin=j\{\omega L1-(1/(\omega C1))\}+E1/I1 \qquad \text{(Equation 4)}$$

The input impedance Zin is a sum of impedances of components in the circuit and pseudo impedance (E1/I1) added by the induced voltage E1.

And Zin has a real part inherited from the added impedance (E1/I1). The real part of Zin is defined as induced resistance r1 in the following Equation 5.

$$r1\equiv\text{Real}(E1/I1)=\text{Real}(j\omega M\times I2/I1) \qquad \text{(Equation 5)}$$

Induced resistance r1 is shown in the following Equation 7, where ratio of the current I2 of the receiver antenna 2 to the current I1 of the transmitter antenna 1 is shown in Equations 6 which uses parameters of real number that are an electric current ratio parameter $\alpha$ and a phase angle $\beta$.

$$I2/I1\equiv\alpha\cdot\exp(-j\alpha) \qquad \text{(Equation 6)}$$

$$r1=\alpha\cdot\omega M\cdot\sin(\beta) \qquad \text{(Equation 7)}$$

Power is most efficiently transferred from the power supply circuit 3 to the transmitter antenna 1 when the impedance Z1, which is the impedance of the power supply circuit 3, matches (equal) with the impedance Zin, which is the impedance of the transmitter antenna 1 looking from the power supply circuit 3 at Port 1 (P1) in FIG. 2(a). When the output impedance Z1 of the power supply circuit 3 is resistance without reactance, the condition of matching is that Z1 is equal to the induced resistance r1. The induced resistance r1 is calculated dividing a component that is in phase with current I1 on the transmitter antenna of the induced voltage E1 by the current I1.

Induced voltage E2 is induced on the receiver antenna 2 by the antenna current I1 on the transmitter antenna 1. The induced voltage E2 is shown in Equation 8.

$$E2=j\omega M\times I1 \qquad \text{(Equation 8)}$$

A voltage Eout at port 2 (P2), at which the receiver antenna 2 is connected with the load circuit 4, is shown as the following Equations 9 and 10.

$$Eout=E2+j\{\omega L2-(1/(\omega C2))\}\times I2 \qquad \text{(Equation 9)}$$

$$Eout=-Z2\times I2 \qquad \text{(Equation 10)}$$

Induced resistance r2 is defined by real part of output impedance caused by induced voltage E2. Following Equation 11 for induced resistance r2 is given.

$$r2\equiv\text{Real}(E2/(-I2))=\text{Real}(-j\omega M\times I1/I2)=(1/\alpha)\cdot\omega M\cdot\sin(\beta) \qquad \text{(Equation 11)}$$

Power transfers most efficiently from the receiver antenna 2 to the load circuit 4 when the output impedance (−E2/I2), where the induced voltage E2 on the receiver antenna 2 works as supplied power, is matched with the sum of the input impedance Z2 of the load circuit 4 and a reactance of the receiver antenna 2 $j\{\omega L1-(1/(\omega C1))\}$. Thereby, when input impedance Z2 of the load circuit 4 has no reactance, the matching condition is that Z2 is equal to the induced resistance r2. The induced resistance r2 is calculated by dividing the component of the voltage E2 that is in phase with the current I2 by the current I2, where E2 is the induced voltage on the receiver antenna 2 by the current I1 on the transmitter antenna 1, I2 is a current on the receiver antenna 2.

Present invention can compose a receiver circuit 4b that is shown in the right part of FIG. 2(b), which is series of a receiver antenna 2 and a primary winding of a transformer, and in which both ends of the secondary winding of the transformer are connected with a load circuit 4 at Port 4 (P4). The receiver circuit 4b in the right part of FIG. 2(b) is equivalent to the receiver circuit 4a in the right part of FIG. 2(a) in the condition where angular frequency $\omega$ is fixed. The circuit shown in FIG. 21(a) is one embodiment of the receiver circuit 4b in the right part of FIG. 2(b) that has a transformer, which connects a receiver antenna 2 with a load circuit 4. The receiver circuit in FIG. 21(a) has a receiver antenna 2 that is coiled (spiral) that combines with the primary winding of the transformer. And the receiver circuit has a inductive coupling wiring 6 that is coiled or spiral, which is the secondary winding of the transformer, which is placed close to the receiver antenna 2 and is in a level parallel to the level (XY-plane) of the receiver antenna 2. The circuit shown in FIG. 21(a) has a transmitter circuit 3a in the left part of FIG. 2(a), where the power supply circuit 3 is connected in series at port 1 (P1) in the middle of the transmitter antenna 1 whose both ends are connected to the capacitance C1. The receiver circuit 4b in the right part of FIG. 2(b) has an inductive coupling wiring 6 that inductively couples with the receiver antenna 2 by mutual inductance M2; both ends of the inductive coupling wiring 6 are connected to a load circuit 4 at port 4 (P4). In the circuit in FIG. 21(a), self-inductance of inductive coupling wiring 6 is small compared to the induced resistance r2, so that the induced resistance (impedance of the inductive coupling wiring 6) looking from the load circuit 4 at port 4(P4) is $(2\pi f\times M2)^2/r2$. Another embodiment for the circuit can be composed with the circuit of the transmitter antenna 1 that is replaced with a transmitter circuit 3b in the left of FIG. 2(b), which has an inductive coupling wiring 6.

Moreover, the circuit in FIG. 21(a) can be replaced with a circuit in which the receiver antenna 2 combines with the inductive coupling wiring 6 that constructs a receiver circuit 4c in the right of FIG. 2(c). In the receiver circuit 4c, port 6 (P6) that is a combination of both ends of the receiver antenna 2 combines with port 4 (P4), which is connected to a load circuit 4. At port 6 (P6), the load circuit 4 and the capacitance C2 are connected in parallel. The induced resistance (impedance) at Port 6 looking from the load circuit 4 is $(\omega \times L2)^2/r2$. That is, in the receiver circuit 4c in FIG. 2(c), the mutual inductance M2 of the inductive coupling wiring 6 in the receiver circuit 4b in FIG. 2(b) is replaced with the effective self-inductance L2 of the receiver antenna 2. The circuit of the transmitter antenna 1 can be replaced with the transmitter circuit 3b in the left of FIG. 2(b), where port 3 (P3) that is a combination of both ends of the inductive coupling wiring 6 is connected to the power supply circuit 3. Moreover, the transmitter circuit 3b can be replaced with the transmitter circuit 3c in the left of FIG. 2(c), where port 5 (P5) that is a combination of both ends of the transmitter antenna 1 is connected to the power supply circuit 3.

An inductive electric power transfer circuit in FIG. 24(a) is composed of a receiver antenna 2 that is a coiled (spiral) antenna wiring, a transmitter antenna 1 that is a dipole antenna, which receives the electromagnetic wave from the air, working for the function of the power supply circuit 3. In the circuit, the dipole antenna receives power of electromagnetic wave from the air and causes electric current on it. The electric current generates induced voltage on the receiver antenna 2. Thus, the dipole antenna has both functions for a power supply circuit 3 and a transmitter antenna 1. The induced voltage generates induced resistance r2 on the receiver antenna 2. Power of electromagnetic wave can be received efficiently from the air when the induced resistance r2 is matched to input impedance Z2 of the load circuit 4. Similarly, an inductive electric power transfer circuits is composed of a transmitter antenna 1 that is a coiled (spiral), the receiver antenna 2 that is a dipole antenna and works for radiating electromagnetic wave and consumes the power. That is, the dipole antenna has functions for a receiver antenna 2 and a load circuit 4. Electromagnetic wave can be efficiently radiated by matching induced resistance r2 of the receiver antenna 2 with the radiation resistance of the dipole antenna that is input impedance Z2 of the function of load circuit 4.

In the following, cases where impedances are matched in an inductive electric power transfer circuit in FIG. 2(a) are analyzed in detail, and angular frequencies 6) that cause resonance are researched in detail. In the case when output impedance Z1 of the power supply circuit 3 is matched with the induced resistance r1 and input impedance Z2 of the load circuit 4 is matched with the induced resistance r2, Equations 1 and 9 yield the following Equations 12 and 13.

$$\omega L1 - (1/(\omega C1)) = -\alpha \cdot \omega M \cdot \cos(\beta) \quad \text{(Equation 12)}$$

$$\omega L2 - (1/(\omega C2)) = -(1/\alpha) \cdot \omega M \cdot \cos(\beta) \quad \text{(Equation 13)}$$

Electromagnetic field on the transmitter antenna 1 and the receiver antenna 2 resonate when Z1=r1 and Z2=r2 and Equations 12 and 13 are satisfied, so that electric power is transferred in full efficiency from the power supply circuit 3 to the load circuit 4.

In this case, when $\cos(\beta)$ is not zero, Equations 7, 11, 12, and 13 yield the following Equations.

$$r1 \cdot r2 = (\omega M)^2 - g1 \times g2 \quad \text{(Equation 14)}$$

$$g1 \equiv \omega L1 - (1/(\omega C1)) \quad \text{(Equation 15)}$$

$$g2 \equiv \omega L - (1/(\omega C2)) \quad \text{(Equation 16)}$$

$$\alpha^2 = \omega g1/g2 \quad \text{(Equation 17)}$$

$$\sin(\beta)^2 = Z1 \cdot Z2/(\omega M)^2 \quad \text{(Equation 18)}$$

When M, L1, C1, L2, and C2 are decided, r1×r2 is given by Equation 14 as a function of ω. And, an electric current ratio parameter α is given by Equation 17. Next, the phase angle δ is given by Equation 18. Next, r1 and r2 are given by Equation 7 and Equation 11. Especially, g1×g2 is positive according to Equation 17. The condition where Equation 14 is satisfied when ωM is small is as follows. That is, a certain value of 6) should exist which is represented by symbol ωo that satisfies g1=g2=0. The condition for that is the following Equation 19.

$$L1 \cdot C1 = L2 \cdot C2 \equiv (1/\omega o)^2 \quad \text{(Equation 19)}$$

(First Type Resonance)

In the condition where Equation 19 is satisfied, when ω is ωo, Equations 12 and 13 yield that $\cos(\beta)$ is zero, $\sin(\beta)$ is one, and g=g2=0. This is named "first type resonance," which will be described later.

(Second Type Resonance)

In the condition where Equation 19 is satisfied, when co is not ωo, Equations 6, 7, 11, and 15 to 17 yield the following Equation 20. This is named "second type resonance".

$$|I2/I1|^2 = \alpha^2 = L1/L2 = C2/C1 = r1/r2 \quad \text{(Equation 20)}$$

Equation 20 yields the following Equation 21.

$$L1 \times |I1|^2 = L2 \times |I2|^2 \quad \text{(Equation 21)}$$

This Equation 21 shows that energy of electromagnetic field on the transmitter antenna 1 is equal to energy of electromagnetic field on the receiver antenna 2, and both antennas mutually exchange the energy of the electromagnetic fields and resonate. This Equation 21 yields the following Equation 22.

$$|I2| = |I1| \times \sqrt{(L1/L2)} \quad \text{(Equation 22)}$$

That is, in the resonance, the ratio of the electric current I1 of the transmitter antenna 1 to the electric current I2 of the receiver antenna 2 is the square root of the ratio of the effective self-inductance L2 of the receiver antenna 2 to the effective self-inductance L1 of the transmitter antenna 1. Equation 22 is satisfied also in an electromagnetic field simulation on the antenna circuits that resonate and has good efficiency (in the efficiency of almost 100%) in energy transfer between the antennas. Since great electric current flows on receiver antenna 2 as shown in Equation 22, high frequent antenna current I2 on the receiver antenna 2 causes change of electromagnetic field, so that it causes induced voltage E1 on the transmitter antenna 1.

In the condition where Equation 19 is satisfied, Equations 7, 11, 12, and 13 yield Equations from 24 through 27 that are with coefficient of coupling k, which is defined by Equation 23.

$$k \equiv M/\sqrt{(L1 \times L2)} \quad \text{(Equation 23)}$$

$$r1 = k\omega L1 \cdot \sin(\beta) \quad \text{(Equation 24)}$$

$$r2 = k\omega L2 \cdot \sin(\beta) \quad \text{(Equation 25)}$$

$$\omega L1 - 1/(\omega C1) = -k\omega L1 \cdot \cos(\beta) \quad \text{(Equation 26)}$$

$$\omega L2 - 1/(\omega C2) = -k\omega L2 \cdot \cos(\beta) \quad \text{(Equation 27)}$$

Equation 26 and 27 yield the following Equation 28.

$$\omega = \omega o/\sqrt{(1 + k \cdot \cos(\beta))} \quad \text{(Equation 28)}$$

The above-mentioned relations can be described as follows.

That is, the antenna system that satisfies Equation of $L \times C1 = L2 \times C2 = 1/\omega o^2$ can transfer electric power in full efficiency when: angular frequency ω of the current that transfers power is the reciprocal of the square root of $L \times C1 \times (1 + k \times \cos$ ($\beta$)), where phase angle $\delta$ is from zero to $\pi$ radian; output impedance Z1 of the power supply circuit 3, which is connected in series with the transmitter antenna 1 at port 1 (P1), is r=k$\omega$L1×sin($\beta$). Input impedance Z2 of the load circuit 4, which is connected in series with the receiver antenna at port 2 (P2), is r2=k$\omega$L2·sin($\beta$). There are upper limits for the induced resistances r with which the power can be transferred from the power supply circuit 3 to the load circuit 4 in full efficiency. The upper limits of the induced resistances r with which electric power can be transferred rises when the induced coupling factor k rises by approximating the air-cored receiver antenna 2 to the facing air-cored transmitter antenna 1. Upper limit of the induced resistance r1 is k$\omega$L1. Upper limit of the induced resistance r2 is k$\omega$L2. Power can be transferred in full efficiency when output impedance Z1 of the power supply circuit 3 is set to the induced resistance r1 that is less than the upper limit, and input impedance Z2 of the load circuit 4 is set to the induced resistance r2 that is less than the upper limit. When output impedance Z1 of the power supply circuit 3 and input impedance Z2 of the load circuit 4 are set smaller than the upper limits of the induced resistances, those impedances can be equal to the corresponding induced resistances by adjusting sin($\beta$), which is less than one, in Equations 24 and 25, so that the impedances match to transfer electric power. In that case, cos($\beta$) is not zero, so that the transmitter antenna 1 and the receiver antenna 2 resonate at angular frequency $\omega$ that is shifted from $\omega$o according to Equation 28.

By applying the second type resonance, an inductive electric power transfer circuit can be composed; the circuit can keep constant impedances of the power supply circuit 3 and the load circuit 4 that match with induced resistances r1 and r2 although arrangement of the transmitter antenna 1 and the receiver antenna 2 is not steady and the coefficient of coupling k changes. The circuit has a power supply circuit 3 whose output impedance Z1 is fixed and is equal to the induced resistance r1 that is less than the upper limit. And the circuit has a load circuit 4 whose input impedance Z2 is fixed and is equal to the induced resistance r2 that is less than the upper limit. The power supply circuit 3 adapts to the change of the coefficient of coupling k by adapting phase angle $\delta$ and angular frequency $\omega$ to resonate. The power supply circuit 3 that adjusts like that can be composed of a positive-feedback circuit that makes the resonance current of transmitter antenna 1 positively return to the power supply circuit 3, and composed of an amplifier that amplifies the return current and outputs it from the power supply circuit 3. As a result, the power supply circuit 3 is adjusted to output electric current I1 that is with resonant angular frequency $\omega$. That is, the antenna circuit can resonate adapting for the change of the coefficient of coupling k. The inductive electric power transfer circuit is effective to keep power transfer in full efficiency when the coefficient of coupling k varies.

Power transfer efficiency Pe of the antenna system is approximately given by the following Equation 29.

$$Pe=(1-\text{ref}2/r2)/(1+\text{ref}1/r1) \quad \text{(Equation 29)}$$

where ref1 is effective resistance of the transmitter antenna 1, ref2 effective resistance of the receiver antenna 2. Equation 29 is effective when the induced resistance r2 is greater than ref2. When the effective resistance of the transmitter antenna 1 (ref1) is smaller than the induced resistance r1, and the effective resistance of the receiver antenna 2 (ref2) is smaller than the induced resistance r2, power is transferred efficiently. When the effective resistances of the antennas (ref) are much less than induced resistances r, the power transfer efficiency becomes almost 100%. The transmitter antenna 1 and the receiver antenna 2 can be dipole antennas or coiled (spiral) antennas that are shown in FIG. 1. When the antennas are coiled, effective self-inductances L1 and L2 of the antennas become greater, induced resistances r1 and r2 becomes greater than that of dipole antennas according to Equations 24 and 25, so that power transfer efficiency Pe, which is calculated using Equation 29, from the transmitter antenna 1 to the receiver antenna 2 becomes greater than that of dipole antennas.

(Third Type Resonance)

Especially, when $\omega \approx \omega$o, left sides of Equations 26 and 27 are almost zero, so that the right sides of them are almost zero, $\beta$ is almost $\pi$/2 radian, cos($\beta$) is almost zero, and sin($\beta$) is almost one. Thereby, Equations 24 and 25 reduce to the following approximate Equations 30 and 31.

$$r1 \approx k\omega L1 \quad \text{(Equation 30)}$$

$$r2 \approx k\omega L2 \quad \text{(Equation 31)}$$

Figure 2:
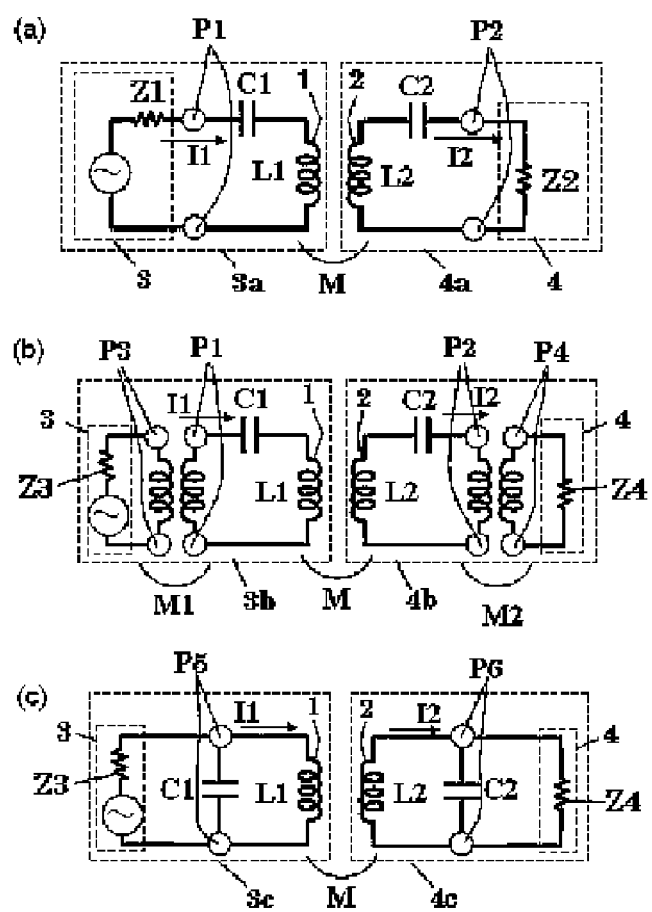
FIG. 2 is a circuit diagram showing the inductive electric power transfer circuit of the present invention.

Namely, in the case of $\omega \approx \omega$o, when output impedance Z1 of the power supply circuit 3 shown in FIG. 2($a$) is matched to induced resistance r1 in Equation 30 and input impedance Z2 of the load circuit 4 is matched to induced resistance r2 in Equation 31, power can be transferred in full efficiency from the power supply circuit 3 to the load circuit 4. The third type resonance is a kind of the second type resonance and a kind of the first type resonance. That is, it is the second type resonance and the first type resonance. In the third type resonance, there are relations, which is shown in Equations 30 and 31, between induced resistances r, coefficient of coupling k, and effective self-inductances L of the antennas. In the third type resonance, when the coefficient of coupling k is known previously, the effective self-inductance L of the antennas can be calculated using the Equations with induced resistances r obtained by simulation. In another case, coefficient of coupling k can be calculated from the induced resistance r obtained by simulation when effective self-inductance L is known previously.

(First Type Resonance)

The case of the first type resonance described before is analyzed in detail as follows. In the first type resonance, Equation 19 is satisfied and sin($\beta$) is one and g1=g2=0. In the case, the phase angle $\delta$, which represents phase difference between antenna currents I1 and I2, is 90 degrees ($\pi$/2 radian). The antenna system resonates with angular frequency $\omega=\omega$o. And Equations 32 to 35 are satisfied.

$$\text{Cos}(\beta)=0 \quad \text{(Equation 32)}$$

$$R1=\omega M\cdot\alpha \quad \text{(Equation 33)}$$

$$R2=\omega M/\alpha \quad \text{(Equation 34)}$$

$$I2/I1=-j\alpha \quad \text{(Equation 35)}$$

The relations can be described as follows. That is, in an antenna system that satisfies L1×C1=L2×C2=1/$\omega$o$^2$, electric power can be transferred in full efficiency on the conditions: angular frequency $\omega$ of the currents that transfer electric power is set to $\omega$o; output impedance Z1 of the power supply circuit 3 that is connected in series with the transmitter antenna 1 is matched with r1=$\omega$M×$\alpha$, where $\alpha$ is a free positive number; the input impedance Z2 of the load circuit 4 that is connected in series with the receiver antenna 1 is matched with r2=$\omega$M/$\alpha$. That is, in the resonance, the angular frequency $\omega=2\pi$f agrees with $\omega$o as shown in Equation 19, and there is a character that the antenna currents ratio $\alpha$ can be set free to transfer electric power. Since the ratio $\alpha$ between the antenna currents is free, electric power can be transferred efficiently when the current I1 on the transmitter antenna 1 is great and great electromagnetic field is generated even if the current I2 on the receiver antenna 2 is small. Oppositely, it means the electric power can be transferred efficiently when the electric current I2 of the receiver antenna 2 is great even if the electric current I1 of the transmitter antenna 1 is small. Product of the induced resistances r1 and r2 is the square of ($\omega$M), and the product is constant. The ratio between the induced resistances r1 and r2 is a square of the ratio $\alpha$ between the antenna currents, and it can be changed freely.

Using the phenomenon at the first type resonance, the inductive electric power transfer circuit can compose the impedance converter of air-core coil that converts the induced resistance r1 of the transmitter antenna 1 to the induced resistance r2 of the receiver antenna 2. That is, the impedance converter that converts the impedance Z1 of the power supply circuit 3 into the induced resistance $r2=(\omega M)^2/Z1$ of the load circuit 4 can be composed of the circuit in FIG. 2(a).

The spacing of the transmitter antenna 1 and the receiver antenna 2 for the impedance converter is changed, so that the coefficient of coupling k is changed and the mutual inductance M is changed. This makes it possible to compose the impedance converter which can change only the induced resistance r2 of the receiver antenna 2 without changing the output impedance Z1 of the power supply circuit 3 on the transmitter antenna. The impedance converter can change the induced resistance r2, which is converted, only by changing one parameter k. It is effective to change the circuit parameter easily and to adjust the impedance easily.

In the following embodiments, the output impedance Z1 of the power supply circuit 3 and the input impedance Z2 of load circuit 4 is given, which enable to transfer electric power in full efficiency from the power supply circuit 3 to the load circuit 4, by electromagnetic field simulation. The induced resistances are given by assuming the values to be the induced resistances r1 and r2. The induced resistance r1 is $\omega M\alpha\cdot\sin(\beta)$, and the induced resistance r2 is $\omega M\cdot\sin(\beta)/\alpha$. In the following electromagnetic field simulations, the transmitter antenna 1 and receiver antenna 2 are air-core coils (spirals). The antennas can resonate even when both antennas are separated to the extent that the coefficient of coupling k of the electromagnetic induction between the antennas is reduced to about 0.01. At the second type resonance of the present invention, the antenna circuits resonate by matching the impedance Z and the induced resistance r, which is shown in Equations 24 and 25 (Equations 30 and 31). The resonance is effective that the electric power can be transferred from the power supply circuit 3 to the load circuit 4 in full efficiency. At the first type resonance of the present invention, matching the impedance Z and the induced resistance r, which is shown in Equations 33 and 34, is effective to transfer the electric power in full efficiency from the power supply circuit 3 to the load circuit 4. The present invention can be applied also to the circuits that fill the dielectric medium between the antennas instead of the vacuum and air, or to the circuits that fills the paramagnetic material between them. Moreover, the inductive power transfer circuit according to present invention is not limited to the usage alone in which the power is transferred for the energy supply. The inductive electric power transfer circuit according to present invention can be used to transfer the power from the transmitter antenna 1 to the receiver antenna 2 for signal propagation.

First Embodiment

According to a first embodiment, an inductive electric power transfer circuit is composed of receiver antenna buried inside of a body, and the transmitter antenna out of the body, so that it transfers the electric power between them through the skin of the body. The first embodiment is described using FIG. 1 to FIG. 12.

In FIG. 1, transmitter antenna 1 is copper ribbon wiring whose width is 1 mm and thickness is 50 µm, and has the shape of one turn coil on the plane whose diameter D is 46 mm. For instance, the transmitter antenna 1 is formed on the polyimide film of 25 µm in thickness. The receiver antenna 2 can be made in a shape of coil, the coil diameter G is 50 mm, and the antenna wiring is covered with polyimide layer of 25 µm in thickness, so that it can be buried inside of a body by an operation. The terminal Port 1 (P1) of the power supply circuit 3 which feeds power is connected in series with the transmitter antenna 1 at the middle of the antenna wiring. A feeder cable which connects the power supply circuit 3 to the transmitter antenna 1 has the characteristic impedance matched to the output impedance Z1 of the power supply circuit 3. For instance, when the output impedance Z1 of the power supply circuit 3 is Q, the feeder cable has the matched characteristic impedance of Q. The feeder of the characteristic impedance can be obtained using a polyimide film that has the relative dielectric constant of 3.5 and is 50 µm in thickness, and the copper wirings, which are 2.4 mm in width and 50 µm in thickness, on both sides of the film. Both ends of the transmitter antenna 1 are connected to a capacitance C1 of 100 pF. The capacitance C1 of 100 pF can be formed with the wiring pattern that consists of two parallel square electrodes of 34 mm in length, and they have air gap of 0.1 mm between them. Additionally, the capacitance of 100 pF can be formed with the pattern that consists of two parallel square electrodes of 46 mm×1.8 mm on both sides of a polyimide film which is 0.025 mm in thickness and 3.5 in relative dielectric constant. The receiver antenna 2 is formed of a copper wiring of 1 mm in width and 50 µm in thickness. The wiring is formed to one turn coil of 50 mm in the coil diameter G, which is covered with polyimide films of 0.025 mm in thickness. The diameter of this receiver antenna 2 is different from the diameter of the transmitter antenna 1. Port 2 (P2) of the terminal of the load circuit 4 is connected in series at the midpoint of the wiring of the receiver antenna 2. Moreover, both ends of the receiver antenna 2 is connected to a capacitance C2 of 90 pF. As shown in the side view in FIG. 1 (b), the transmitter antenna 1 and the receiver antenna 2 separate by spacing h between the antennas, along the direction axis of the antenna coil (in a direction perpendicular to the xy plane). The inductive electric power transfer circuit in the circuit diagram in FIG. 2(a) is composed. The power supply circuit 3 outputs the electric current I1 to the transmitter antenna 1. The output current I1 is made to return to the power supply circuit in positive phase. And the power supply circuit is made to amplify the current and oscillate so that the antenna circuit resonates at the angular frequency $\omega$.

(Induced resistances of antennas with which the impedance of power supply circuit 3 and load circuit 4 are matched)

Figure 3:
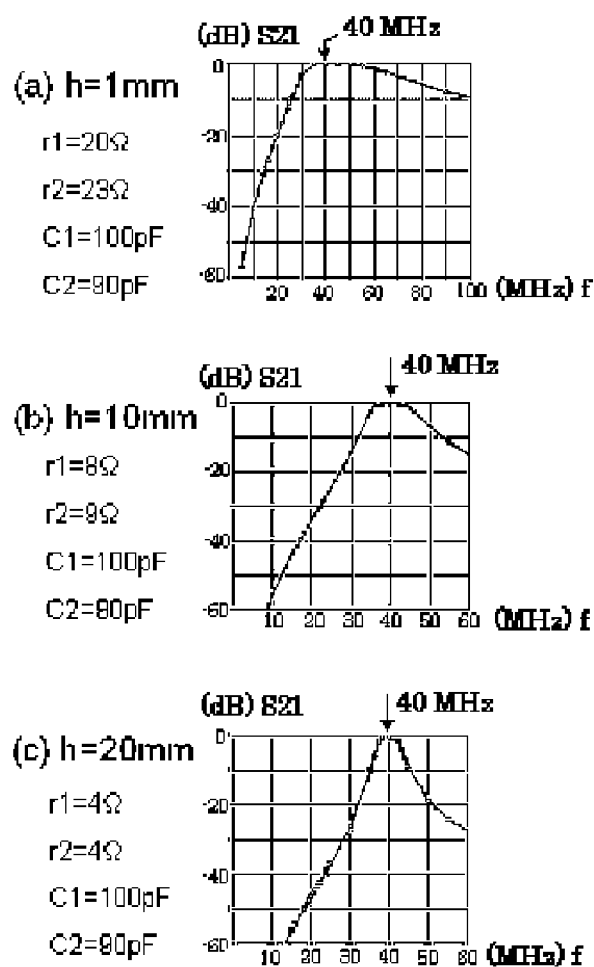
FIG. 3 is a graph for S parameter (S21) for the power transfer according to the first embodiment of the present invention.

Power transfer efficiency Pe for the third type resonance of the inductive electric power transfer circuit is given by electromagnetic field simulation, and the induced resistances r1 and r2 generated are given as follows. That is, the output impedance Z1 of the power supply circuit 3 with which power is most efficiently transferred from the power supply circuit 3 to the load circuit 4 is found out. It is assumed that the value is the induced resistance r1 of the transmitter antenna 1. And, it is assumed that the value of the load impedance Z2 of the load circuit 4 with which the power is most efficiently transferred is induced resistance r2 of the receiver antenna 2. The graphs from FIG. 3(a) to FIG. 3(c) show results of the simulations for some spacings h between the antennas. The graphs are for S parameters (S21) of power transmission from the power supply circuit 3 to the load circuit 4 in decibels (dB) as a function of frequency f of the antenna current I1, which is the current, which is flowed from the power supply circuit, on the transmitter antenna 1. FIG. 3(*a*) shows the result when spacing h between antennas of FIG. 1 is 1 mm. FIG. 3(*b*) shows the result when h=10 mm. FIG. 3(*c*) shows the result when h=20 mm. In FIG. 3(*a*), when the spacing h between the antennas is 1 mm, the induced resistance r1 of the transmitter antenna 1 is Ω, and the induced resistance r2 of the receiver antenna 2 is Ω. When the impedance Z of the power supply circuit 3 and the load circuit 4 are matched to the corresponding induced resistances r, the antennas resonate and the power transfer efficiency is the highest. For example, the power transfer efficiency is almost 100% when the frequency f of the antenna current I1 is 40 MHz. The spacing h between antennas is needed to be shorter than the near-field-distance which is calculated as (wavelength of resonant electromagnetic field)/(2*n*). In this embodiment, when the frequency f is 40 MHz, the wavelength of the electromagnetic field is about 7.5 m. So that, even if the spacing h between the antennas is 20 mm, the spacing h between the antennas is sufficiently small as one-sixtieth of (wavelength of resonant electromagnetic field)/(2*n*). In FIG. 3(*b*), when the spacing h between antennas is 10 mm, r1 is 8Ω and r2 is 9Ω. In FIG. 3(*c*), when the spacing h between antennas is 20 mm, r1 is 4Ω and r2 is 4Ω. Even if the spacing h between the antennas is 20 mm in FIG. 3(*c*), S21 is −0.3 dB, which is 92 percent of the electric power can be transferred.

As described above, almost 100% of the power is transferred when the spacing h between antennas is 1 mm, 10 mm, and 20 mm. There is a frequency band (resonant frequency bandwidth) of the frequency f at which power is transferred efficiency almost 100%. When the spacing h between the antennas is 1 mm in FIG. 3(*a*), there is a frequency band from 35 MHz to 55 MHz, so that the width of frequency band is almost 20 MHz. The width of resonant frequency band where the power transfer efficiency is almost 100% becomes narrower as the spacing h between antennas grows. In FIG. 3(*b*), when the spacing h between antennas is 10 mm, the resonant frequency band is from 36 MHz to 46 MHz and the width of resonant frequency band is almost 8 MHz. In FIG. 3(*c*), when the spacing h between antennas is 20 mm, the resonant frequency band is from 38 MHz to 41 MHz and the width of resonant frequency band is almost 3 MHz.

In FIGS. 3(*a*) to (*c*), the resonant frequency f given by simulation is 40 MHz. Since the capacitance C1, to which both ends of the transmitter antenna 1 is connected, is 100 pF, the effective-self-inductance L1 of the transmitter antenna 1 is calculated and the result is 160 nH. Since the capacitance C2, to which both ends of the receiver antenna 2 is connected, is 90 pF, the effective-self-inductance L2 of the receiver antenna 2 is 180 nH. When the capacitances C that connects both ends of these antennas become much greater than these values, the distribution of electric current on the antenna seems to be the same as that at the edge of the antenna wiring, and the current is equal anywhere on the antenna. Therefore, when those capacitances C are much greater than these values, the effective self-inductances L of the antennas seem to be constant.

Figure 4:
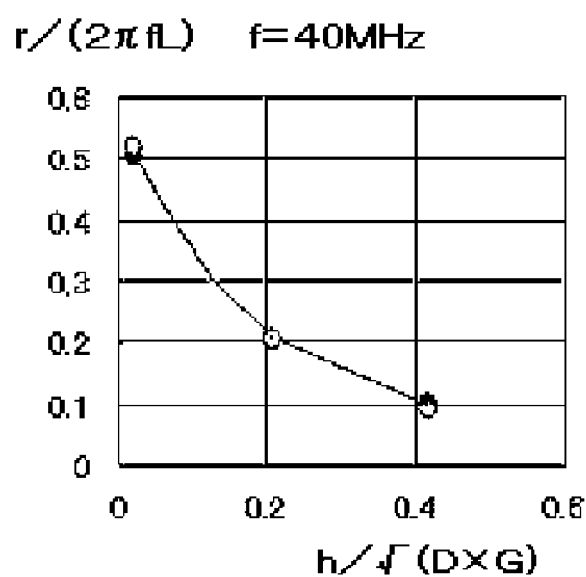
FIG. 4 is a graph for induced resistance (r) as a function of spacing h between antennas according to the first embodiment of the present invention.

In the graph in FIG. 4, the black circle denotes the value that is calculated as the induced resistance r1 which is obtained by simulation is divided by (2π*f*L1) in the vertical axis. The value of r/(2π*f*L1) is non-dimensional parameter. A white circle denotes the value that is calculated as r is divided by (2π*f*L2), and the value of r/(2π*f*L2) is non-dimensional parameter. The graph of FIG. 4 shows these values as a function of the non-dimensional parameter (h/√(D×G)), which shows the spacing h between antennas divide by the square root of the product of the coil diameters D and G. In the graph of FIG. 4, the solid line denotes calculated values by the following approximate Equation 36.

$$r/(2\pi fL)=1.8\text{EXP}(-4.3\sqrt{(0.04+\sqrt{(1/t^2-1)})}) \quad \text{(Equation 36)}$$

$$t=\sqrt{D\times G/(((D+G)/2)^2+h^2))} \quad \text{(Equation 37)}$$

Where, the value t in the approximate Equation 36 is given by Equation 37. In FIG. 4, approximate Equation 36, which is shown as the solid line, agrees with the simulation result well.

Since FIG. 4 shows a graph for the value that is the same as that of Equation 30 and Equation 31, which is a graph for coefficient of coupling k of the electromagnetic induction of the transmitter antenna 1 and the receiver antenna 2. In order to verify it, following Equation 38 was made by calculating exact coefficient of coupling k of the electromagnetic induction between both coils theoretically when the transmitter antenna 1 and the receiver antenna 2 are circular coils of diameters D and G.

Where the coefficient A in Equation 38 is given by Equation 39

$$k=A\times((-t+2/t)\times K(t)-(2/t)\times E(t)) \quad \text{(Equation 38)}$$

$$A=\mu\sqrt{(D\times G/(L1\times L2))}/2 \quad \text{(Equation 39)}$$

Where, μ is permeability, t is defined by Equation 37, K(t) is complete elliptic integral of the first kind, E(t) is complete elliptic integral of the second kind.

The following approximate Equation 40 is obtained from this Equation.

$$k=4.86A\{1.8\text{EXP}(-4.3\sqrt{(0.04+\sqrt{(1/t^2-1)})})\} \quad \text{(Equation 40)}$$

Substituting L1=160 nH, L2=180 nH, and space permeability μ=1.26 μΩ·s/m into the formula of A, 4.86 A, which is the first coefficient of Equation 40, becomes 0.88, which is almost one in a margin of error of 10 percent. That is, the coefficient of coupling k of the electromagnetic induction between both coils, which is given by Equation 40, is the value given by Equation 36 in a margin of error of 10 percent. Therefore, the graph of FIG. 4 agrees with a graph for coefficient of coupling k of the electromagnetic induction of the transmitter antenna 1 and the receiver antenna 2. In FIG. 4, the solid line denotes a graph given by approximate Equation 36, which is approximated to that for coefficient of coupling k of electromagnetic induction between both antennas. In FIG. 4, the graph for coefficient of coupling k calculated by Equation 36 well agrees with that for r/(2π*f*L) given by simulation. Therefore, it can be said that the result given by simulation agrees with the result calculated from Equation 30 and Equation 31.

(Bandwidth of Frequency in which Power Transfer Efficiency is Saturated)

In FIG. 4, when h=1 mm and (h/√(D×G)) is 0.02, coefficient of coupling k is 0.5 and induced resistance r is about 20Ω. When h=10 mm and (h/√(D×G)) is 0.2, coefficient of coupling k is 0.2 and induced resistance r is about 8Ω. When h=20 mm and (h/√(D×G)) is 0.4, coefficient of coupling k is 0.1 and induced resistance r is about 4Ω. FIG. 3(*a*) shows a graph for transmitting efficiency Pe of electric power, which is represented by S parameter S21, as a function of frequency when h=1 mm, coefficient of coupling k=0.5, and induced resistance r is almost 20Ω. FIG. 3(*b*) shows a graph for that when h=10 mm, coefficient of coupling k is 0.2, and induced resistance r is 8Ω. The graph in FIG. 3(*c*) shows a graph for that when h=20 mm, coefficient of coupling k is 0.1, and the induced resistance r is 4Ω. In these graphs in FIG. 3, the upper limit of the bandwidth of frequency f with which transmitting efficiency Pe of the power is saturated is almost $f/fo=1/\sqrt{(1-k)}$, and the lower bound is almost $f/fo=1/\sqrt{(1+k)}$. Therefore, when coefficient of coupling k is enlarged, it is effective that ratio f/fo of the bandwidth of frequency f with which transmitting efficiency Pe of the power is saturated can be enlarged into the width of coefficient of coupling k. Therefore, when coefficient of coupling k is enlarged, the frequency band in which power transfer efficiency Pe from the transmitter antenna 1 to the receiver antenna 2 is saturated can be enlarged. It is effective for sufficiently matching the resonant frequency of both antennas by loose accuracy, and it becomes easy to manufacture and adjust both antenna circuits.

Since in this embodiment, the bandwidth of frequency ratio f/fo in which transmitting efficiency Pe of the power is saturated is almost coefficient of coupling k, the bandwidth of frequency f of the inductive electric power transfer circuit can secure the tolerant width of 0.4% or more of the resonant frequency by setting coefficient of coupling k of the transmitter antenna 1 and the receiver antenna 2 to 0.004 or more. Therefore, it is desirable to adjust coefficient of coupling k to 0.004 or more. In that case, the difference of the resonant frequencies for both antennas is within the range sufficiently to transfer the without obstacle. This is because it can be comparatively facilitated to make the resonant frequencies for the transmitter antenna 1 and the receiver antenna 2 can be close within 0.4% in difference by making characteristics of parts used for the inductive electric power transfer circuit close within 0.4% in difference.

Thus, it is effective in this embodiment that the power can be efficiently transferred by transferring the power from transmitter antenna 1 in vitro to receiver antenna 2 in vivo by high frequency f of 40 MHz, and matching impedance Z1 and Z2 of the power supply circuit 3 and the load circuit 4 with induced resistances r1 and r2, which are from 20Ω to 4Ω. This effect is achieved by making the distance between antennas below (wavelength of the electromagnetic field with which the antenna resonates)/(2π), which is in near field. The inductive electric power transfer circuit according to this embodiment has little output impedance Z1 of the power supply circuit 3, which is matched to the induced resistance r to transfer power, and input impedance Z2 of load circuit 4, which is matched to the induced resistance r to transfer the power, such as 20Ω to 4Ω. Therefore, the voltage of circuit can be lower, being effective for high safety of the power transfer circuit. In this embodiment, it is effective that the power can be transferred by non-contact in the efficiency of 92% from the circuit in vitro to the circuit in vivo separated by a tissue of 20 mm in thickness. Moreover, the receiver antenna 2 is effective in burring easily in vivo because the antenna can be small and thin, such as 50 mm square antenna and the antenna has the wiring of the copper 50 μm in thickness and 1 mm in width covered with an insulator of 25 μm in thickness.

(Modification 1)

Figure 5:
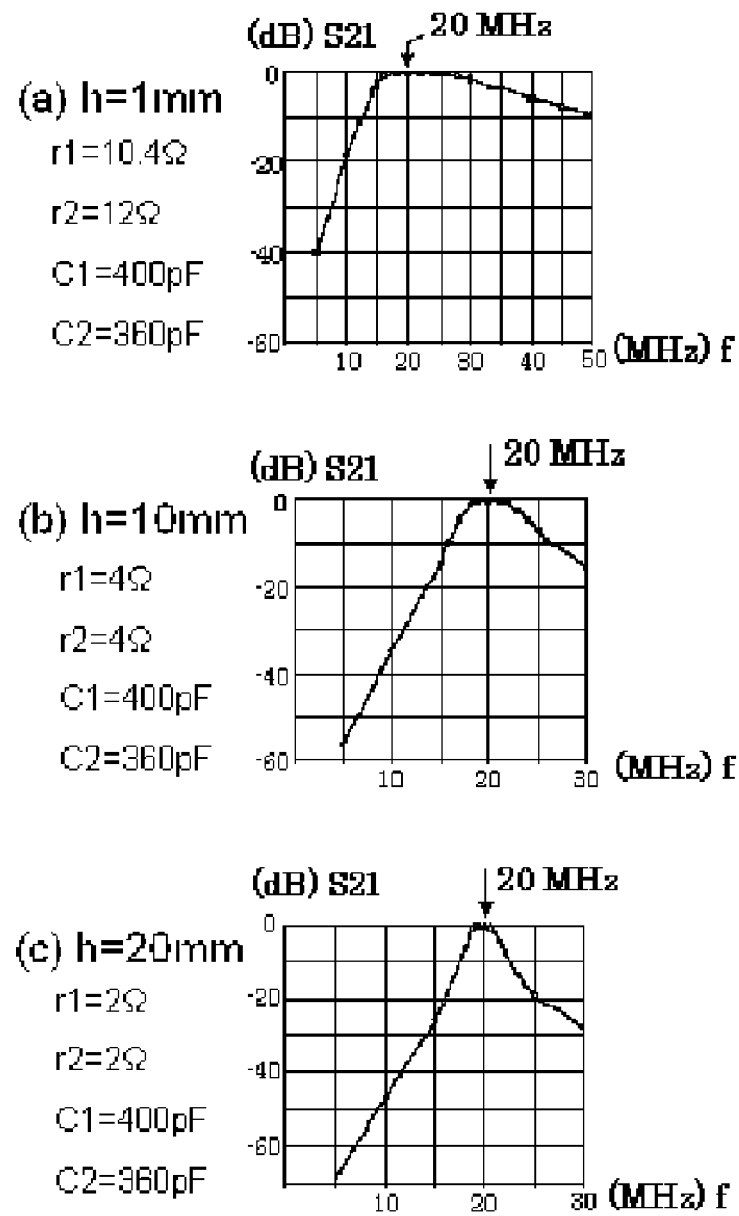
FIG. 5 is a graph for S parameter (S21) for power transfer according to modification 1 of the first embodiment of the present invention.
Figure 6:
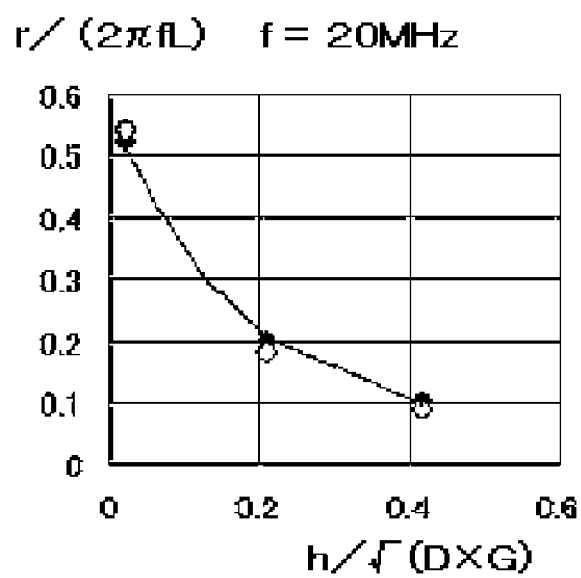
FIG. 6 is a graph for induced resistance (r) as a function of spacing h between antennas according to a modification 1 of the first embodiment of the present invention.

Modification 1 composes the inductive electric power transfer circuit, in which the angular frequency ω of the current is lower than that of the first embodiment, which supplies power to the receiver antenna 2 in vivo buried. In modification 1, capacitance C1 between the ends of the transmitter antenna 1 and capacitance C2 between the ends of the receiver antenna 2 are almost four times of them in the first embodiment, such as C1=400 pF and C2=360 pF. FIG. 5 shows the graph for S-parameters (S21s) of the power transmission given by simulation as a function of frequency f. In the graph of FIG. 5, resonant frequency f, at which the power is transferred, is 20 MHz, which is half of that in the first embodiment. FIG. 6 shows the graph for the induced resistance r in modification 1, which is represented by $r/(2\pi fL)$ that is coefficient of coupling k and a non-dimensional parameter, as a function of spacing h between antennas, which is represented by $(h/\sqrt{(D\times G)})$ that is a non-dimensional parameter. In FIG. 6, similarly to FIG. 4, the black circle and the white circle denote the result in simulation, and the solid lines denote the calculated value using approximate Equation 36. Also in FIG. 6, the simulation result well agreed with the calculated results using approximate Equation 36. In FIG. 6, when h=1 mm and $(h/\sqrt{(D\times G)})$ is 0.02, coefficient of coupling k is 0.5 and induced resistance r is about 10Ω. When h=10 mm and $(h/\sqrt{(D\times G)})$ is 0.2, coefficient of coupling k is 0.2 and induced resistance r is 4Ω. When h=20 mm and $(h/\sqrt{(D\times G)})$ is 0.4, coefficient of coupling k is 0.1 and induced resistance r is 2Ω. Since resonant frequency, f, becomes half, induced resistances, r, become half.

(Modification 2)

Figure 7:
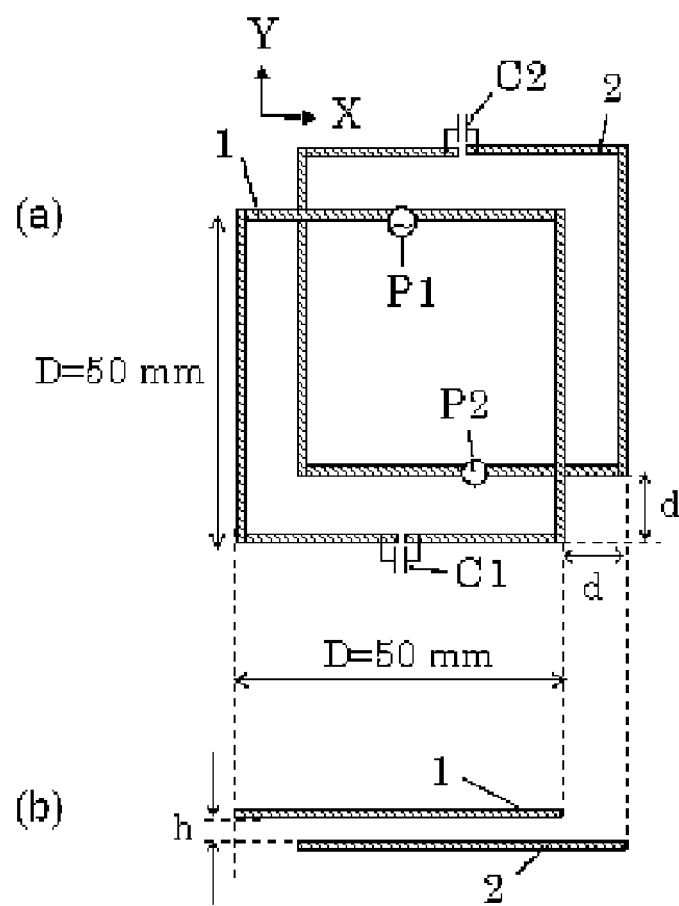
FIG. 7 is a plan view and side view showing the transmitter antenna and the receiver antenna of a modification 2 of the first embodiment of the present invention.
Figure 8:
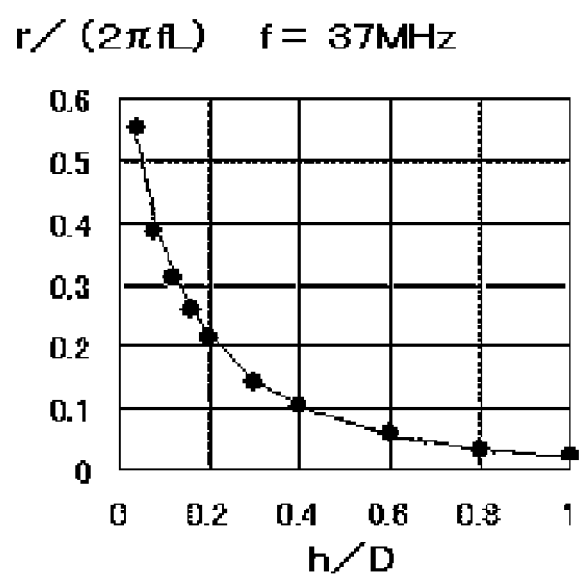
FIG. 8 is a graph for induced resistance (r) as a function of spacing h between antennas according to the modification 2 of the first embodiment of the present invention.

Modification 2 composes the inductive electric power transfer circuit which transfers electric power through a wall of a house. As shown in FIG. 7, the transmitter antenna 1 and the receiver antenna 2 have the same size, which have diameter, D, of 50 mm both in length and in breadth, and are formed on the polyimide membrane of 50 μm in thickness, respectively. The antenna-wiring is 1 mm in width and is made of copper of 50 μm in thickness, and the capacitance C1 and C2, which is between both ends of each antenna, are adjusted to 100 pF. The antenna-wiring is covered with printed solder resist of almost 30 μm in thickness or insulating film such as polyimide membrane etc. In this case, shifting distance d, which is the length to shift the receiver antenna 2 from transmitter antenna 1 along the direction X and Y of a horizontal plane (XY plane), was set to zero and the case was simulated. As a result, it is confirmed that the antenna current resonates at frequency f of 37.4 MHz, and it has understood that the effective self-inductance of the antenna is L=L2=L=176 nH. FIG. 8 shows a graph for the induced resistance r, which is represented by the non-dimensional parameter of $r/(2\pi fL)$=coefficient of coupling k, as a function of the spacing h between antennas, which is represented by the non-dimensional parameter (h/D). The graph of FIG. 8 shows the resistances at the cases where spacing h between antennas, which is between antennas along the direction of the antenna-coil-axis, is from 2 mm to 50 mm. In the graph of FIG. 8, the black circle denotes r obtained from simulation, and the solid line denotes that calculated using approximate Equation 36. The values obtained from simulation well agree with those calculated using approximate Equation 36.

In FIG. 8, when (h/D) is 1, induced resistance r is 0.8Ω and coefficient of coupling k is almost 0.02. When (h/D) is two, induced resistance r obtained from simulation is 0.24Ω and coefficient of coupling k is 0.006, and, power transfer efficiency, Pe, is 22 percents. Since the rate of frequency, f/fo, with which power-transfer-efficiency, Pe, is saturated has a band-width which is almost same as the coefficient of coupling k, when coefficient of coupling k is 0.006, the bandwidth of frequency f with which power transfer efficiency Pe is saturated is almost 0.6% of resonant frequency fo. Therefore, even though parts which are almost 0.6 percents different in characteristics from designed ones are used, the difference of the resonant frequency of the transmitter antenna 1 and the receiver antenna 2 can remain in the tolerance. Thus, it is effective for composing a practical inductive electric power transfer circuit to make the spacing, h, which is between the coiled transmitter antenna 1 and the receiver antenna 2, within twice the diameter D of the coils of the antennas.

Figure 9:
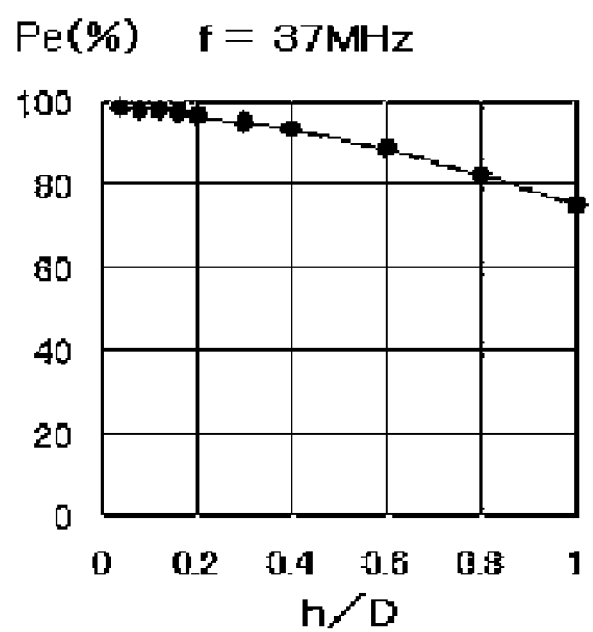
FIG. 9 is a graph for power transfer efficiency as a function of spacing h between antennas according to the modification 2 of the first embodiment of the present invention.

FIG. 9 shows a graph for power transfer efficiency Pe in modification as a function of (h/D) at 37 MHz of resonant frequency f with the antenna whose wiring is copper of 1 mm in width.

In FIG. 9, the power transfer efficiency Pe decreases as (h/D) grows. The reason is that as (h/D) grows coefficient of coupling k becomes small and induced resistances r1 and r2 calculated with Equations 24 and 25 become small, so that the power transfer efficiency Pe calculated with Equation 29 becomes small. In FIG. 9, even though spacing h between antennas is widened as large as 50 mm that is the same distance as coil diameter D(h/D=1), the power transfer efficiency is almost 75%, so that power can be transferred efficiently. For example, the transmitter antenna 1 and the receiver antenna 2 with coil of 50 mm in diameter D can be separated by a wall of 50 mm in thickness, and the power supply circuit 3 is in the house. The device can supply power to the outdoor load circuits 4 such as illuminating device or display device outside the house in the efficiency of almost 75% by facing the antennas in parallel and in non-contact without making a hole for wiring through the wall of the house.

When induced resistance r can be enlarged more than the conductive resistance of the antenna-wiring by enlarging the effective inductance L by increasing number of rolling of the coiled (spiral) wiring of the antenna. That is effective to enlarge the power transfer efficiency Pe according to Equation 29 that is for power transfer efficiency Pe. On the other hand, when the capacitor C1 and C2 (capacitance element), which connect to both ends of each antenna, become large capacitance, the resonant angular frequency ω becomes small to decrease induced resistance r, so that the power transfer efficiency Pe becomes small according to Equation 29.

(Modification 3)

Figure 10:
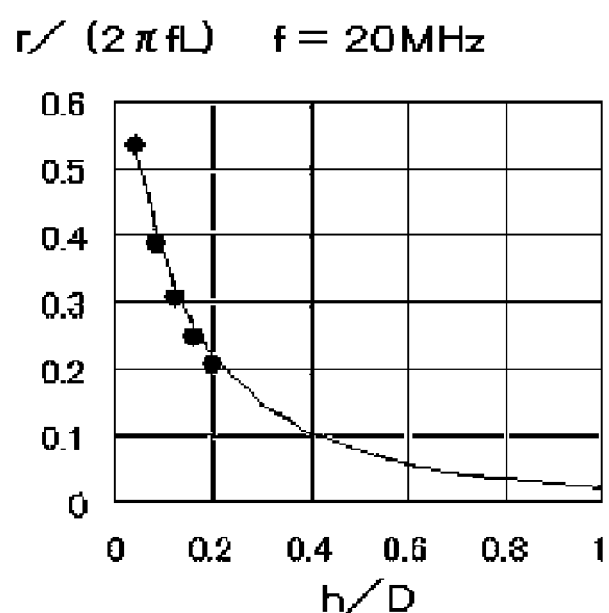
FIG. 10 is a graph for induced resistance (r) as a function of spacing h between antennas according to a modification 3 of the first embodiment of the present invention.

Modification 3 composes an inductive electric power transfer circuit in which power is transferred through a wall of a house and the angular frequency ω of the current is reduced than in the former circuit. The case where the capacitance C1 between the edges of transmitter antenna 1, and C2 of receiver antenna 2 are set up 400 pF, which is four times the frequency in the modification 2, is simulated, and resonant frequency f can be reduced to almost 20 MHz, which is half the frequency in modification 2. FIG. 10 shows the graph for induced resistance r, which is represented by the non-dimensional parameter r/(2πfL), as a function of spacing h between antennas, which is represented by the non-dimensional parameter (h/D). In FIG. 10, the black circles denote induced resistances r=r1=r2 according to simulation, and the solid line denotes them calculated using approximate Equation 36. Also in FIG. 10, the simulation well agreed with calculation using approximate Equation 36.

(Modification 4)

Figure 11:
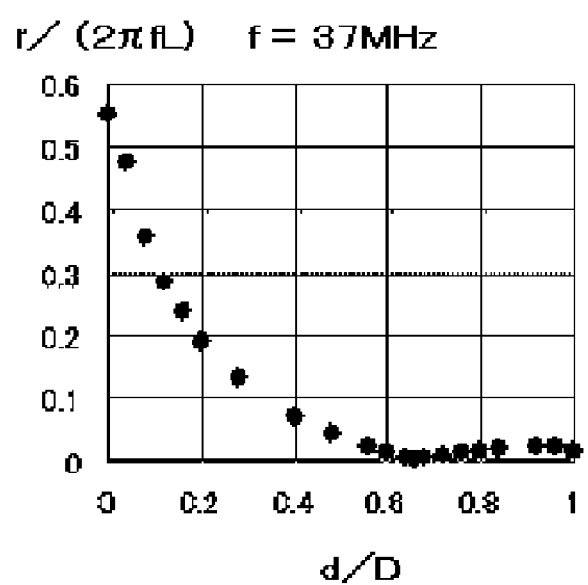
FIG. 11 is a graph for induced resistance (r) as a function of shifting distance d between antennas according to a modification 4 of the first embodiment of the present invention.

Modification 4 also composes an inductive electric power transfer circuit that transfers power through an insulating material such as a wall of a house. The circuit uses antennas facing each other in parallel as shown in FIG. 7 in which the receiver antenna 2 is shifted from the transmitter antenna 1 on XY-antenna-plane by the shifting distance d along both X-axis and Y-axis. In this inductive electric power transfer circuit, when the capacitance C1, which is between ends of the transmitter antenna 1, and C2, which is between ends of the receiver antenna 2, are fixed to 100 pF and spacing h between the antennas is fixed to 2 mm, the matching condition of the circuit is obtained as a function of the shifting distances d by simulation. The result is described as follows. Resonant frequency f of the antenna circuit in this case is fixed to fo of 37.4 MHz, which is same as the modification 2. FIG. 11 shows a graph for induced resistance r, which is represented by the non-dimensional parameter r/(2πfL), at the resonant frequency f=37.4 MHz as a function of shifting distance d between the coils, which is represented by the non-dimensional parameter (d/D), where the black circles denote the results obtained from simulation. Induced resistance r that appears on the antenna decreases when the position of the coil shifted horizontally. The cause of this effect is that coefficient of coupling k of the electromagnetic induction of the coil becomes small when the position of the coil is shifted.

Figure 12:
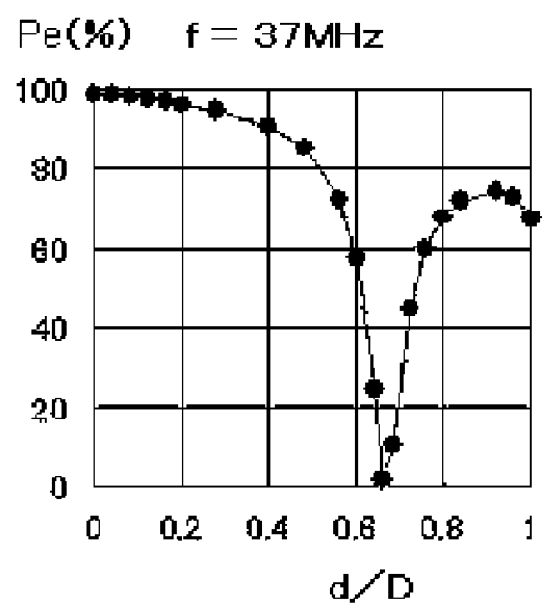
FIG. 12 is a graph for power transfer efficiency as a function of shifting distance d between antennas according to the modification 4 of the first embodiment of the present invention.

FIG. 12 shows a graph for power transfer efficiency from the power supply circuit 3 to the load circuit 4 as a function of shifting distance d between the coils, which is represented by the non-dimensional parameter (d/D). FIG. 12 shows that, when (d/D) is not more than 0.4, that is the shifting distance d is not more than 20 mm, then the power transfer efficiency is not less than 90%, the power can be transferred very efficiently. The power transfer efficiency becomes zero at the point in which (d/D)=0.66, where d is shifting distance between the coils. The cause of this effect is as follows. The sum of the magnetic field lines that is enclosed within the coil becomes zero in the layout of the point because the direction of the magnetic field lines passing the coil area reverses on the boundary of the wiring of the other antenna. Therefore, induced voltage and coefficient of coupling k becomes zero at this layout. In FIG. 12, the power transfer efficiency recovers when (d/D) exceeds 0.4.

When the axis of the coil of the transmitter antenna 1 is only horizontally shifted from that of the receiver antenna 2 by 100 mm, which is twice the coil diameter D=50 mm of the antenna, induced resistance r becomes 0.23Ω, and r/(2πfL), which is equal to coefficient of coupling k of the coil of the antenna system, becomes 0.005, so that power transfer efficiency Pe becomes 20%. Thus, when the axis of the coil of an antenna is shifted from the other antenna twice or less of the antenna-coil-diameter D, coefficient of coupling k of the antenna becomes 0.005 or greater and bandwidth of frequency f, with which power transfer efficiency Pe is saturated, becomes 0.5% of resonant frequency fo. Therefore, when components with tolerance of 5% s are used, the difference of the resonant frequency of transmitter antenna 1 and receiver antenna 2 can be restricted within tolerance. Therefore, a practicable inductive electric power transfer circuit, whose antennas are coils with diameter D, can be made by shifting the receiver antenna 2 from the transmitter antenna 1 by shifting distance d which is within twice the antenna-coil-diameter D.

The coefficient of coupling k between the transmitter antenna 1 and the receiver antenna 2 is not restricted over 0.004. When the coefficient of coupling k is smaller than that, the inductive electric power transfer circuit with which the power is efficiently transferred can be composed by adding a circuit that tunes resonant frequency f of the transmitter antenna 1 to the resonant frequency of the receiver antenna 2.

Second Embodiment

A second embodiment also composes an inductive electric power transfer circuit that supplies the power from the transmitter antenna 1 in vitro to the receiver antenna 2 in vivo through the outer skin. The inductive electric power transfer circuit is adapted to the circumstances that the position of the transmitter antenna 1 and receiver antenna 2 are not steady and coefficient of coupling k of electromagnetic induction changes, to keep the stability of power transfer. In this embodiment, the inductive electric power transfer circuit is composed of the transmitter antenna 1 and the receiver antenna 2 in FIG. 7, and the antennas are operated at the second type resonance of the principle of the present invention.

Figure 13:
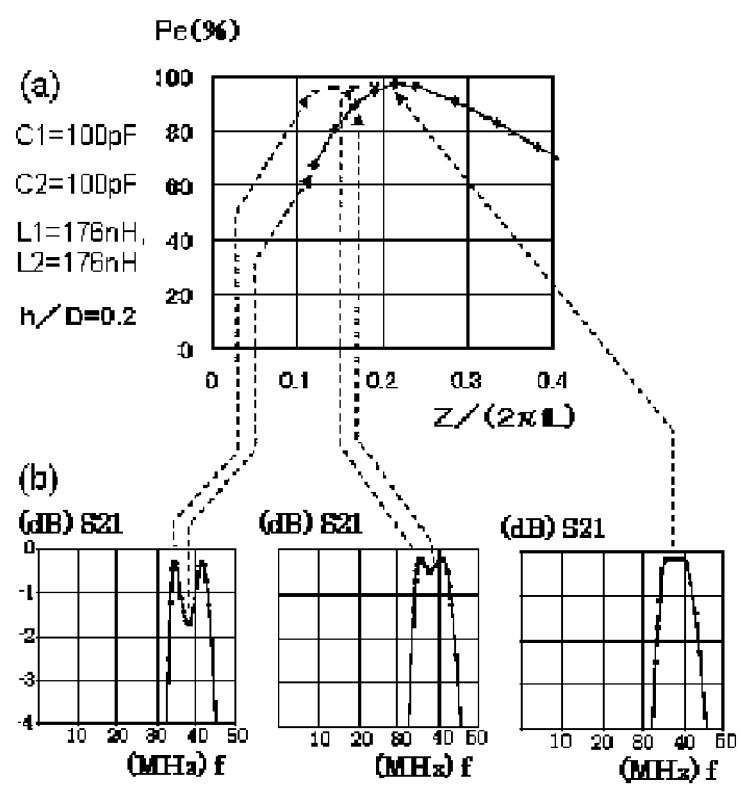
FIG. 13 is a graph for power transfer efficiency as a function of impedance Z of a power supply circuit and a load circuit according to a second embodiment of the present invention.

FIG. 13(*a*) shows the power transfer efficiency (%) as a function of impedance Z, which is represented by the non-dimensional parameter $Z/(2\pi fL)$, of power supply circuit 3 and load circuit 4 when the antenna-spacing h between the transmitter antenna 1 and the receiver antenna 2 in FIG. 7(*a*) is 10 mm (h/D=0.2).

In FIG. 13(*a*), the solid line shows a graph for power-transfer-efficiency when frequency f of electric current I1, which is supplied from the power supply circuit 3 to the transmitter antenna 1, is fixed to 37.4 MHz. The dotted line shows a graph for power-transfer-efficiency for the second embodiment in which the frequency f of the electric current I1 is adapted and adjusted to the frequency at which the maximum power is transferred.

FIG. 13(*b*) shows a graph for power transfer efficiency Pe, which is represented by S-parameters (S21) in dB, as a function of frequency f of the antenna current when the impedances Z are fixed in the inductive electric power transfer circuit. In FIG. 13(*a*), when $Z/(2\pi fL)$ is larger than 0.22 (Z is 9Ω in this case), the power transfer efficiency decreases. This value 0.22 is equal to coefficient of coupling k of the electromagnetic induction. On the other hand, when $Z/(2\pi fL)$ is smaller than 0.22 (Z is 9Ω in this case), which is the value of the coefficients of coupling k, the graph splits into two graphs according to conditions described below. (1) When frequency f for power transfer is fixed to 37.4 MHz, the power transfer efficiency decreases as the impedances Z of the power supply circuit 3 and the load circuit 4 decrease more than induced resistance r. (2) On the other hand, the power transfer efficiency hardly decreases as shown by the broken line in FIG. 13(*a*) when frequency f of the antenna current is adjusted in order to transfer maximum power which is at one of the two peaks of S21 (which represents power transfer efficiency Pe) in FIG. 13(*b*). In the second embodiment, the resonant frequency f is adjusted to the frequency in which the power is transferred at maximum power transfer efficiency Pe.

The inductive electric power transfer circuit of the second embodiment keeps the second type resonance, in which ω is not ωo, of the principle according to present invention even when the position of the transmitter antenna 1 and the receiver antenna 2 and the coefficient of coupling k of electromagnetic induction are not steady. In the second embodiment, input impedance Z2 of the load circuit 4 is fixed to $Z1 \times (L2/L1)$, and output impedance Z1 of the power supply circuit 3 is fixed to a value smaller than the upper limit of induced resistance r1. The resonant angular frequency 6) of the electric current in power supply circuit 3 is adjusted to keep the resonance when the coefficient of coupling k changes according to the change of the distance between the transmitter antenna 1 and the receiver antenna 2. For this purpose, the resonant frequency adjustment circuit that changes the angular frequency ω into the value that most enlarges electric current I1 of the transmitter antenna 1 is built into the power supply circuit 3. The circuit changes the angular frequency ω into the value that cause the largest resonant electric current by returning the current of the transmitter antenna 1 to the power supply circuit 3 with the positive-feedback circuit from the power supply circuit 3. The adjusted value of the angular frequency ω is square root of the reciprocal of $L1 \cdot C1 \cdot (1+k \cdot \cos(\beta))$. So that, the inductive electric power transfer circuit of the second embodiment transfers the power in maximum efficiency by self-adjusting the angular frequency ω of the current from the power supply circuit 3.

In the second embodiment, the phase angle δ changes from ($\pi/2$) when ω of Equation 28 changes from ωo of Equation 19. Therefore, $\cos(\beta)$ changes from zero to limits, ±1. And the resonance-angular-frequency ω of Equation 28 changes from ωo to the ω of Equation 41.

$$\omega \approx \omega o / \sqrt{(1 \pm k)} \qquad \text{(Equation 41)}$$

Then, $\sin(\beta)$ changes from one to about zero, and induced resistances r1 and r2 in Equations 24 and 25 are reduced less than kωL1 and kωL2 of the upper limit values.

Thus, in the second embodiment, the resonance-angular-frequency ω shifts from ωo so that the small induced resistances r1 and r2, which are calculated with Equations 24 and 25, match to the output impedance Z1 of the power supply circuit 3 and to the load impedance Z2 of the load circuit 4, so as to transfer power in full efficiency. In this case, because the ratio of induced resistance r1 and r2 becomes the ratio of effective-self-inductance L1 and L2, the ratio of the output impedance Z1 of the power supply circuit and the input impedance Z2 of the load circuit is fixed to the ratio of effective-self-inductances L1 and L2. Thus, the inductive electric power transfer circuit of the second embodiment is effective to keep the power transmission in full efficiency and to keep the resonance of the antenna circuits even if the distance between the antennas is not stable.

Third Embodiment

Figure 14:
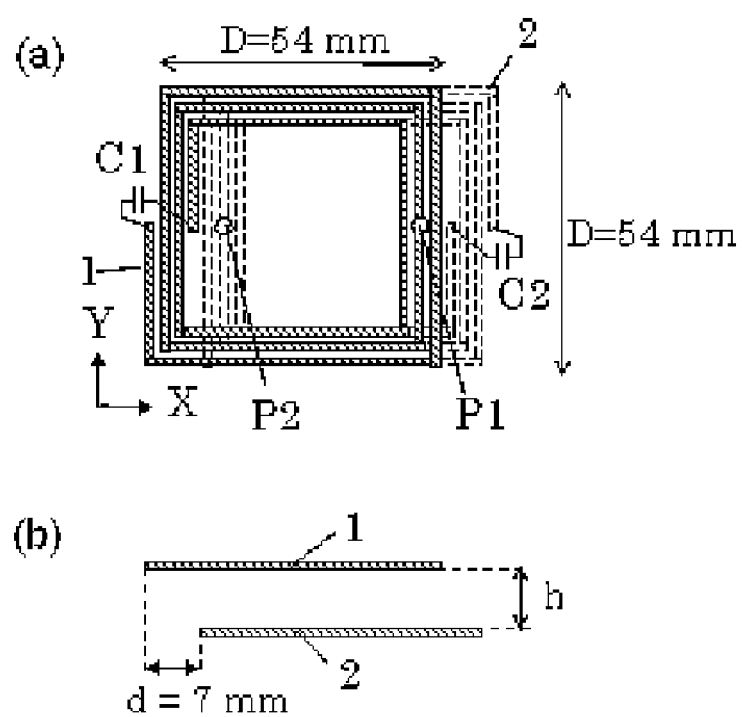
FIG. 14 is a plan view and side view showing a transmitter antenna and a receiver antenna according to a third embodiment of the present invention.

In the third embodiment, an inductive electric power transfer circuit transfers electric power through a wall of a house. The inductive electric power transfer circuit has many turned spiral wiring for antennas, so that induced resistance of the antenna is great and is close to the characteristic impedance of the feeder that connects the power supply circuit 3 to the transmitter antenna 1 and transfers power. This inductive electric power transfer circuit is operated at the third type resonance of the principle of the present invention. FIG. 14(*a*) shows a front view of the transmitter antenna 1 and the receiver antenna 2 of the inductive-electric-power-transfer-circuit according to the third embodiment. FIG. 14(*b*) shows a side view of them. Similarly to the first embodiment, the power supply circuit 3 is connected to the transmitter antenna 1 and the load circuit 4 is connected to the receiver antenna 2. In FIG. 14, the transmitter antenna 1 is composed as follows. The antenna is a 3-turn copper coil whose diameter D is 54 mm set on a polyimide film whose thickness is 50 μm. The coil is a line which is 1 mm in width and is 50 μm in thickness. Both ends of the antenna are connected to C1 of 280 pF in capacitance. Port 1 (P1) is connected to the middle of the antenna to feed power from the power supply circuit 3. The receiver antenna 2 is the same in size and shape as the transmitter antenna 1, which is three turned coil and whose diameter is 54 mm in square. Both ends of the antenna is connected to the capacitance C2 of 280 pF. And port 2 (P2), which is the terminal of load circuit 4, is set at the middle of the antenna. FIG. 14(*b*) shows a side view of the coils of the transmitter antenna 1 and the receiver antenna 2, which are placed on levels in parallel. The antennas are separated by spacing h along the vertical direction to the level (XY-plane) of the coil, and the axis of a coil is shifted from the axis of the other coil by shifting distance d of 7 mm along X-axis without shifting along Y-axis.

The results of simulation are that the resonant frequency f is 9 MHz and effective-self-inductance L1 of the transmitter antenna 1 and effective-self-inductance L2 of the receiver antenna 2 are 1.2 μH, respectively. In this embodiment, since both the transmitter antenna 1 and the receiver antennas 2 are three turned coils, whose number of turn is three times the number of turns of coils in the first embodiment, effective-self-inductances L=L1=L2 of the antennas are almost seven times, which is almost square of the number of turns of the coils, the L of the antennas in the first embodiment. Graphs that are similar to them in FIG. 3 for power transfer efficiency as a function of frequency are obtained. The graphs are at frequencies close to resonant frequency f=9 MHz. In this embodiment, since effective-self-inductance L is seven times the L of the first embodiment, though the frequency f of the resonance reduces from 40 MHz of the first embodiment to 9 MHz, kωL of induced resistance r increases more than the first embodiment. Then, the impedances Z of power supply circuit 3 and the load circuit 4 that match them can be large. There is an effect that when induced resistance r grows, power transfer efficiency Pe grows, which is calculated using Equation 29.

FIG. 15(*a*) shows a graph for the third embodiment for induced resistance r, which is represented by non-dimensional parameter r/(2πfL), as a function of spacing h between antennas, which is represented by non-dimensional parameter (h/D), when resonant frequency f is 9 MHz. In FIG. 15(*a*), the black circles denote data obtained by simulation, and the solid lines denote data calculated using approximate Equation 36. The data obtained by simulation roughly agree with data calculated using approximate Equation 36 in FIG. 15(*a*). FIG. 15(*b*) shows the graph for power transfer efficiency from power supply circuit 3 to load circuit 4 as a function of spacing h between antennas, which is represented by non-dimensional parameter (h/D). FIG. 15(*b*) shows that power can be transferred in the power transfer efficiency of almost 90%, which is very efficient, when spacing h between antennas is almost 60 percent of coil diameter D (h/D=0.6), where spacing h between antennas is almost 30 mm.

(Modification 5)

Figure 16:
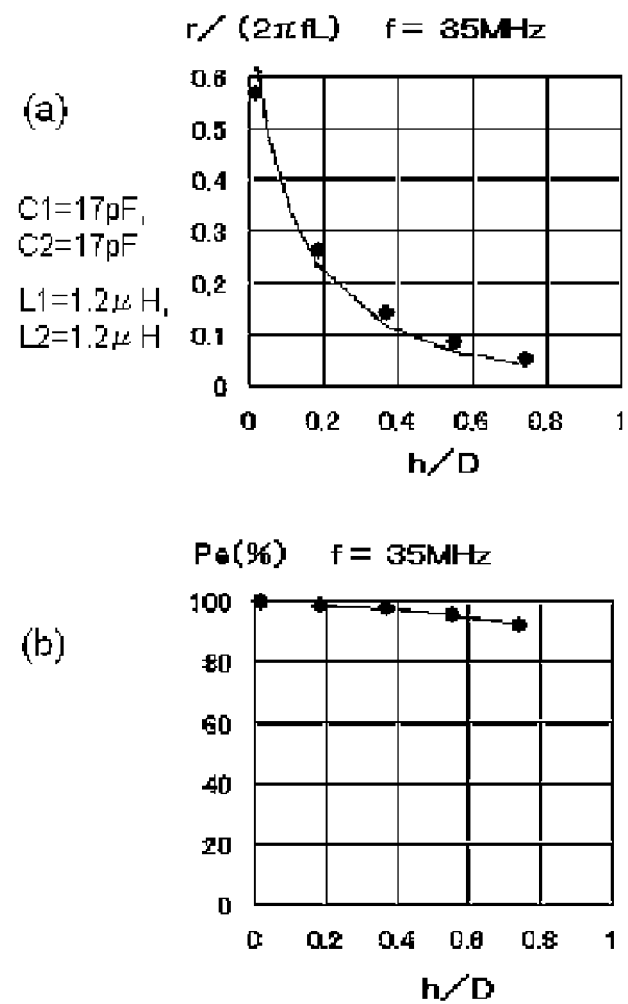
FIG. 16(a) is a graph for induced resistance (r) as a function of spacing h between antennas according to a modification 5 of the third embodiment of the present invention.
FIG. 16(b) is a graph for power transfer efficiency as a function of spacing h between antennas according to the modification 5 of the third embodiment of the present invention.

In modification 5; the capacitance C1 between the edges of the transmitter antenna 1 and the capacitance C2 between the edges of the receiver antenna 2 are 17 pF, which are 1/16 times the capacitances in the third embodiment. In modification 5, the resonant frequency f rises to 35 MHz. FIG. 16(*a*) shows the graph for the induced resistance r, which is represented by non-dimensional parameter r/(2πfL), as a function of spacing h between antennas, which is represented by non-dimensional parameter (h/D). Since the capacitances C1 and C2, which are between ends of antenna, are reduced to one-sixteenth the capacitances in the third embodiment; the resonant frequency f becomes 35 MHz, which is four times the frequency in the third embodiment. As shown in FIG. 16(*a*), the result of simulation, which is denoted by black circle, roughly agreed with the result calculated using approximate Equation 36, the result of Equation 36 is denoted by solid line. FIG. 16(*b*) shows the graph for power transfer efficiency from the power supply circuit 3 to the load circuit 4 as a function of spacing h between antennas, which is represented by non-dimensional parameter (h/D). FIG. 16(*b*) shows that power transfer efficiency is almost 90% when spacing h between antennas is 40 mm, which is 80 percent of coil diameter D, (h/D=0.8), then the power is transferred very efficiently. FIG. 16(*b*) shows that when spacing h between antennas rises 1 mm and (h/D) is 0.6, coefficient of coupling, k=r/(2πfL), becomes almost 0.6, and induced resistance r becomes 158Ω. In this embodiment, since effective inductance L rises to seven times the inductance in the first embodiment; at 35 MHz in this embodiment, value of induced resistance, r=kωL, rises seven times the resistance in the first embodiment at 40 MHz; and impedances Z in the power supply circuit 3 and the load circuit 4 that are matched to the induced resistances rise seven times the impedances in the first embodiment. The power transfer efficiency Pe, which is calculated using Equation 29 rises as the induced resistance r grows.

Fourth Embodiment

A fourth embodiment composes an inductive electric power transfer circuit which has a feeder with high characteristic impedance that connects a power supply circuit 3 to a transmitter antenna 1, and the induced resistance on the antenna is raised and the resonant frequency f in the third embodiment is raised by removing external capacitor between both ends of antenna. That is, in the fourth embodiment, both ends of the transmitter antenna 1 in FIG. 14 are free, and both ends of the receiver antenna 2 are free. There is no external capacitor between the ends of the antennas, but there are parasitic capacitances, whose values are denoted as min, between the ends, which are capacitances C1 and C2. This inductive electric power transfer circuit works in the third type resonance of the principle of the present invention. The antenna system for the inductive electric power transfer circuit of the fourth embodiment resonates at a frequency f=154 MHz. Calculating the parasitic capacitance (min) between ends of a coiled antenna, the parasitic capacitance yields 1 pF using the resonant frequency f=154 MHz and effective self-inductance L=1.2 μH of the antenna coil in which an external capacitor is added. That is, even though without external capacitor between both ends of the antenna wiring, the antenna can be represented by a circuit in FIG. 2(*a*). In the circuit, capacitance C1 of almost 1 pF is connected between both ends of the transmitter antenna 1, and capacitance C2 of almost 1 pF is connected between both ends of the receiver antenna 2.

Figure 17:
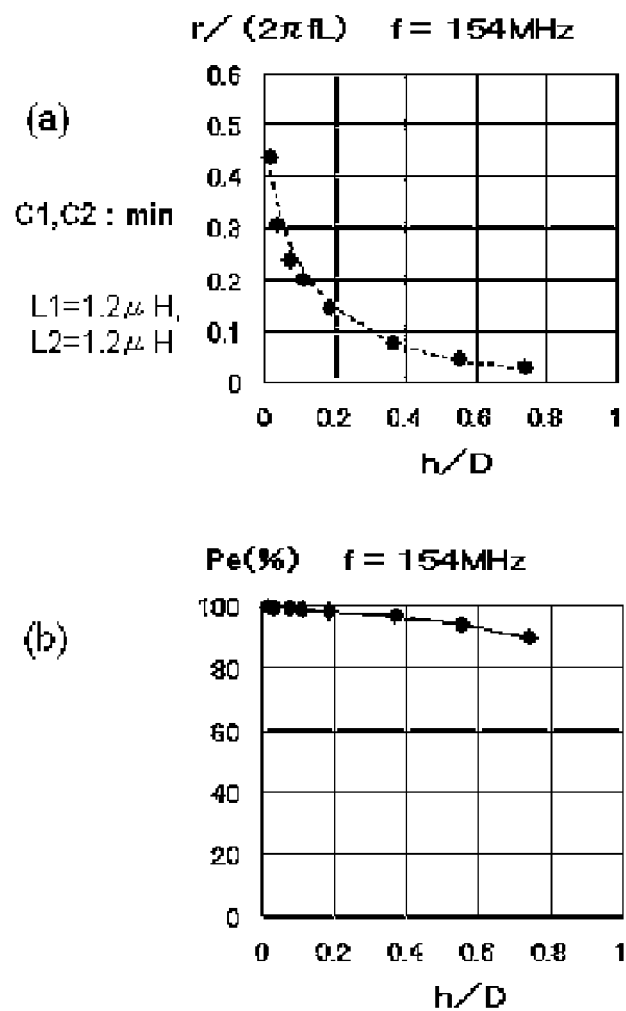
FIG. 17(a) is a graph for induced resistance (r) as a function of spacing h between antennas according to a fourth embodiment of the present invention.
FIG. 17(b) is a graph for power transfer efficiency as a function of spacing h between antennas according to the fourth embodiment of the present invention.

FIG. 17(*a*) shows a graph for induced resistance r, which is represented by non-dimensional parameter r/(2πfL), in the fourth embodiment at resonant frequency f=154 MHz as a function of spacing h between antennas, which is represented by non-dimensional parameter (h/D). In calculating r/(2πfL), the effective self-inductance L of 1.2 μH is used, which is obtained when an external capacitor is added to the coil of the antenna. The black circle denotes simulation result and the dotted line denotes (2/π) times the value that is calculated using approximate Equation 36. When an external capacitor but parasitic capacitance is not added between ends of the antenna, the antenna current becomes small as it approaches the ends of the antenna, which is different from when an external capacitor is added between the ends of the antenna. The average value of the antenna current is (2/π) times the value of the electric current at the port in the middle of the antenna. Therefore, a dotted line shows a graph for (2/π) times the value of right side of approximate Equation 36. The graph is compensated for their reduction of average antenna current from the current at the port. The compensated value agreed with the value obtained from simulation. Otherwise, this compensation is needed because the effective self-inductance L of the antenna coil changes according that both ends of the antenna are connected with an external capacitor or are without that. L used in approximate Equation 36 is executed self-inductance L that changes according to distribution of the current on the antenna. The value of effective inductance L of the antenna when both ends of the antenna are free is (2/π) times the value of L when both ends of the antenna are connected with a big capacitance, so that approximate Equation 36 is used with compensation for the effective inductance L from that obtained when an external capacitor is connected with both ends of the antenna.

FIG. 17(a) shows that when spacing h between the antennas is 4 mm, (h/D) is 0.074, R/(2πfL) is 0.22 and induced resistance r is 260Ω. According to the fourth embodiment, induced resistance r is adjusted to almost 260Ω by setting the spacing h between the antennas to almost 4 mm. The value of induced resistance r matches well with characteristic impedance of the feeder that is composed of two parallel lines. The characteristic impedance of the feeder that is composed of two parallel lines is 277Ω when distance between the two parallel lines is ten times the radius of the lines, so that the characteristic impedance is close to 260Ω which is the value of the induced resistance r. According to the fourth embodiment, the induced resistance r and the characteristic impedance of the feeder are high, which matches the induced resistance, so that electric current on the feeder, which transfers power, is low, thereby the loss caused by the electric current on the feeder, which has resistance, is reduced.

FIG. 17(b) shows a graph for power transfer efficiency from power supply circuit 3 to load circuit 4 as a function of spacing h between the antennas, which is represented by non-dimensional parameter (h/D). FIG. 17(b) shows that there is almost 90% power transfer efficiency when spacing h between the antennas is almost 43 mm, which is 80% of coil diameter D(h/D=0.8), thereby power can transfer very efficiently.

Fifth Embodiment

An inductive electric power transfer circuit according to a fifth embodiment has a transformer using the second type resonance of the principle of the present invention. The inductive electric power transfer circuit is shown in FIG. 2(a), where a transmitter antenna 1 and receiver antenna 2 are air-core coiled, and the distance between the antennas is less than one for 2π the wavelength of resonant electromagnetic wave. The circuit has the transformer that converts output impedance Z1 of a power supply circuit 3 into load impedance Z2 of a load circuit 4. The load impedance Z2 is (L2/L1) times Z1. The ratio between the impedances is adjusted by changing the self-inductances L1 and L2 by changing number of turns of the air-core coiled antennas.

The circuit according to the fifth embodiment uses the second type resonance of the principle of the present invention in which the resonance angular frequency ω is different from ωo and induced resistance r of the coiled antenna changes according to Equations 24 and 25, in which induced resistance r is proportional to effective self-inductance L of the coiled wiring antenna and the proportional factor is product of coefficient of coupling k, 2πf, and sin(β). There is an effect that the transformer can convert output impedance of the power supply circuit 3 connected with the transmitter antenna, impedance which is not more than kωL1, into the impedance seen from the receiver antenna, impedance which is not more than kωL2. According to the fifth embodiment, the transmitter antenna 1 and the receiver antenna 2 are copper-spiral patterns, which are air-coiled wiring patterns, they are formed by etching copper foils on polyimide films. The space between the antennas is filled with air or insulating material without ferromagnetism. When the antennas are set close to each other, coefficient of coupling k becomes high, so that upper limit of impedance that can be converted with the transformer can be high. Therefore, it is desirable to set the antennas close to each other in the air (or insulating resin). In this transformer, impedance conversion rate (L2/L1) is designed by setting effective self-inductances L1 of the transmitter antenna 1 and L2 of the receiver antenna 2 by setting number of turns of coils of the antennas. Effective self-inductances L of the coiled wirings of the antennas almost change in proportion to the square number of turns. Thus, the transformer according to the fifth embodiment is the inductive electric power transfer circuit that converts the impedance Z1 of the power supply circuit 3 to the impedance Z2 of the load circuit 4, and transfers almost 100% power from the power supply circuit 3 to the load circuit 4.

The transformer according to the fifth embodiment is designed that the output impedance Z1 of the power supply circuit 3 is matched to the induced resistance r1 of the transmitter antenna 1, and the input impedance Z2 of the load circuit 4 is matched to an induced resistance r2 of the receiver antenna 2. Induced resistances r1 and r2 which are matched to impedances Z1 and Z2 are reduced by reducing sin(β) of Equations 24 and 25.

The resonant angular frequency ω that satisfies the impedance matching condition varies from ωo to (ωo/√(1±k)), which is shown in Equation 41, according to 6 as shown in Equation 28. According to Equation 28, when cos(β) is negative, the resonant angular frequency ω shifts higher than ωo to the right peak in the graph of FIG. 12(b). Then, the current I2 on the receiver antenna 2 flows in the opposite direction of the current I1 on the transmitter antenna 1, canceling effect of each other, so that whole antenna system generates little electromagnetic field into the air, thereby reducing electromagnetic emission noise (EMI) caused by the transformer.

When cos(β) is positive, the resonant angular frequency ω shifts lower than ωo to the left peak in the graph of FIG. 12(b). Then, the current I2 on the receiver antenna 2 flows in the same direction of the current I1 on the transmitter antenna 1, so that there is a problem that whole antenna system generates greater electromagnetic field into the air. However, there is a utility that plural receiver antennas 2 can be set in parallel as the antennas are in common with the axis of the coiled wiring of the antennas. Therefore, the plural receiver antennas 2 can receive induced electric power, respectively.

The transformer according to the fifth embodiment can be reduced in weight and size when the antennas are air-coiled, which are a transmitting antenna 1 and a receiver antenna 2. The antennas are separated by a distance of less than 1/(2π) times the wavelength of resonant electromagnetic wave; they are faced each other in the air or insulating resin. Moreover, the transformer according to the fifth embodiment can be used at high frequencies without restriction, frequency in which conventional transformer with a ferromagnetic core cannot be used due to characteristics at the frequencies of the ferromagnetic substance.

Sixth Embodiment

Figure 18:
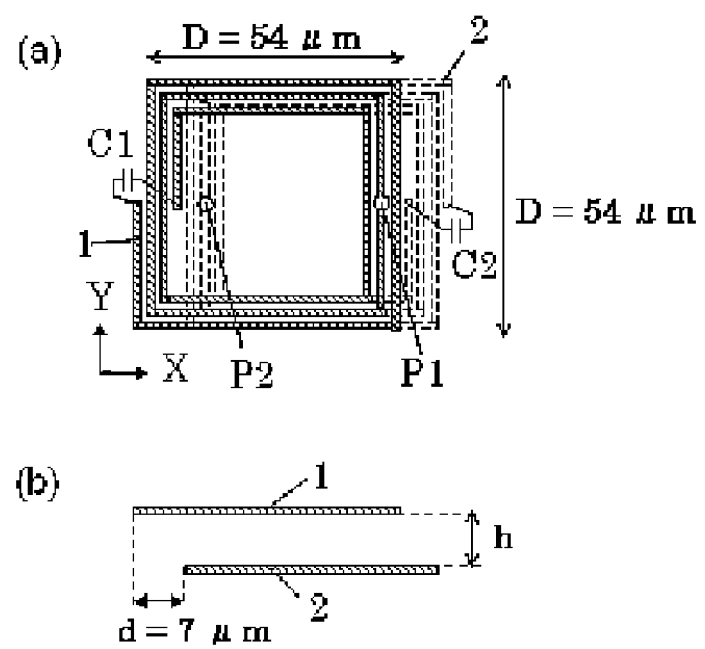
FIG. 18 is a plan view and side view showing a transmitter antenna and a receiver antenna according to a sixth embodiment of the present invention.

An inductive electric power transfer circuit according to a sixth embodiment is in an integrated circuit, and transfers electric power between trace layers. FIG. 18(a) shows a plan view of a transmitter antenna 1 and a receiver antenna 2 according to the sixth embodiment, and FIG. 18(b) shows a side view of them. This inductive electric power transfer circuit works in the third type resonance of the principle of the present invention. A terminal Port 1 (P1) for the power supply circuit 3 is set up in the middle of the wiring of the transmitter antenna 1, and a terminal Port 2 (P2) for the load circuit 4 is set up in the middle of the wiring of the receiver antenna 2. FIG. 18 shows coils of the transmitter antenna 1 and the receiver antenna 2 whose sizes are 1/1000 times the sizes of the coils for the third embodiment. The coils are made of copper in each trace layer in the chip of the integrated circuit, and are 1 µm in thickness. That is, the transmitter antenna 1 and the receiver antenna 2 are three-turned coils whose diameters D and G are 54 µm, and line widths of them are 1 µm. It is desirable that the antenna coils are placed in global-routing layers in insulating resin over the chip of integrated circuit. Moreover, both ends of the coiled wirings of the antennas are free and have capacitances between them whose values are denoted by min, which is C1 for the transmitter antenna 1 and C2 for the receiver antenna 2. Moreover, an inductive electric power transfer circuit can be composed that supply electric power from a substrate on which a chip of an integrated circuit is mounted to the chip of the integrated circuit without line; where a copper-wiring transmitter antenna 1 is formed in a trace layer of the substrate, and a coiled-copper-wiring receiver antenna 2 is formed is another trace layer in the chip of the integrated circuit. Both axes of the coils are separated only along X-axis by distance d of 7 µm, and are at the same level along Y-axis. The coil of the transmitter antenna 1 and the coil of the receiver antenna 2 are faced each other in parallel and separated by spacing h between the antennas as shown in FIG. 18(b).

Figure 19:
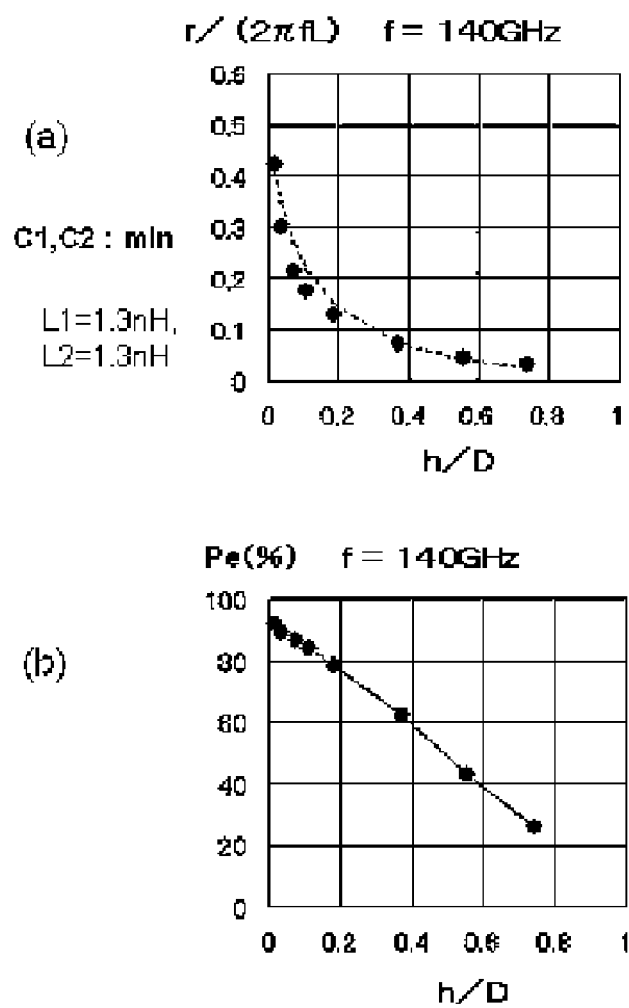
FIG. 19(a) is a graph for induced resistance (r) as a function of spacing h between antennas according to the sixth embodiment of the present invention.
FIG. 19(b) is a graph for power transfer efficiency as a function of spacing h between antennas according to the sixth embodiment of the present invention.
Figure 23:
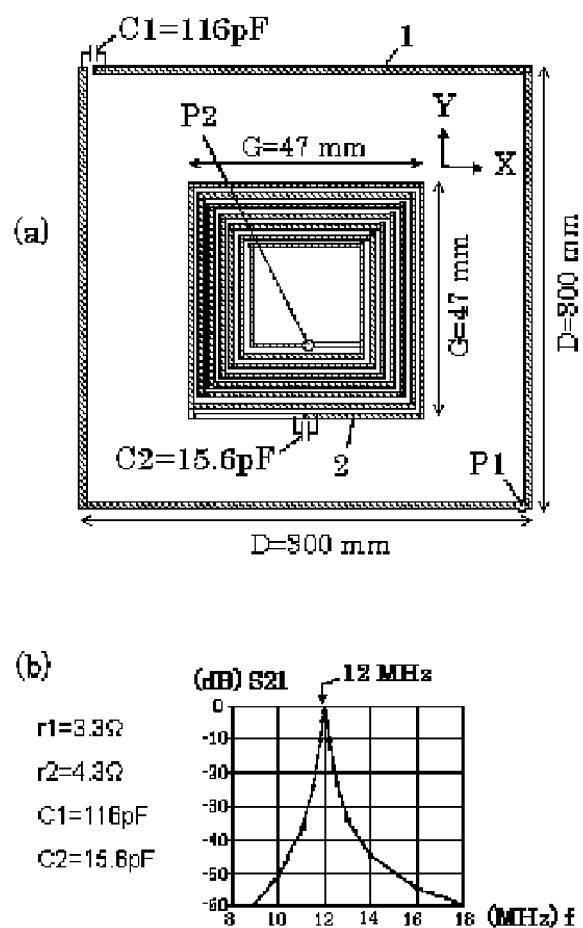
FIG. 23(a) is a plan view of the transmitter antenna and the receiver antenna according to a twelfth embodiment of the present invention.
FIG. 23(b) is a graph for S parameter (S21) of power transfer according to the twelfth embodiment of the present invention.

FIG. 19(a) shows a graph for induced resistance r in this case at resonant frequency f=140 GHz, resistance which is represented by non-dimensional parameter $r/(2\pi fL)$, as a function of spacing h between antennas, which is represented by non-dimensional parameter (h/D). Effective self-inductances L of the coiled antennas are 1.3 nH. The coiled antennas have parasitic capacitance, min, of almost 0.001 pF between both ends of the antennas, respectively. In FIG. 19(a), the black circle denotes simulation, and the dotted line denotes $(2/\pi)$ times the value of Equation 13. The graph of the black circles, which show simulation, agrees with the graph of the dotted line as the graph for the fourth embodiment does. When spacing h between the antennas is almost 10 µm, which is almost 20% of the coil diameter D(h/D=0.2), $r/(2\pi fL)$ is almost 0.12, where induced resistance r is almost 140Ω. When spacing h between the antennas is almost 20 µm, which is almost 40% of the coil diameter D(h/D=0.4), $r/(2\pi fL)$ is almost 0.08, where induced resistance r is almost 90Ω. The impedance of the power supply circuit 3 and the load circuit 4 are matched to these induced resistances. FIG. 19(b) shows power transfer efficiency from the power supply circuit 3 to the load circuit 4 as a function of spacing h between antennas, which is represented by non-dimensional parameter (h/D). FIG. 19(b) shows that power transfer efficiency is almost 80% when spacing h between antennas is almost 10 µm, which is almost 20% of coil diameter D(h/D=0.2), transferring power efficiently. When the spacing h between antennas is almost 20 µm, which is almost 40% of the coil diameter D(h/D=0.4), power transfer efficiency is almost 60%. By applying this effect, the semiconductor integrated circuit can be composed with a transmitter antenna 1 and a receiver antenna 2 which are coiled wirings of 54 µm in diameter, which are separated by spacing h between antennas that is from 10 µm to 20 µm, and which are faced each other. The circuit transfers power efficiently without power lines. Moreover, when spacing h between the antennas, spacing which is spacing between layers for signal wiring and power transfers through which, is enlarged by several times, similarly enlarging diameters D of the antennas by several times, the inductive-electric-power-transfer circuit can transfer power more efficiently. Furthermore, as shown in FIG. 23, a circuit can be composed with a chip of integrated circuit, which has a receiver antenna 2 in a trace layer, on a substrate, which has a copper transmitter antenna 1 in a trace layer, where the transmitter antenna 1 in the substrate is larger than the receiver antenna 2 in the integrated circuit.

Seventh Embodiment

An inductive electric power transfer circuit according to a seventh embodiment is composed with a transmitter antenna 1 which is almost 300 mm in diameter and is connected with a power supply circuit 3, a receiver antenna 2 which is almost 300 mm in diameter in an electric display device. Electric power is transferred from the transmitter antenna 1 to the receiver antenna 2 through space between them. The receiver antenna 2 is connected with a load circuit 4 of the electric display device to work the device. This inductive electric power transfer circuit works in the third type resonance of the principle of the present invention. In the seventh embodiment, electric power is transferred from the transmitter antenna 1 to the receiver antenna 2, which are three-turn-coiled copper wirings and face in parallel each other. The antennas are almost 300 mm in diameter, which is six times the antennas in FIG. 14(a) of the third embodiment. The wirings of the antennas are 10 mm in width and 50 µm in thickness. These antenna wirings can be formed with etched-copper foil of 50 µm in thickness laminated on polyimide films. Effective self-inductances L1 and L2 of these coiled antennas are 4.9 µH. Capacitances C1 and C2, which are 100 pF, connect both ends of coiled wirings of the antennas, respectively. In this case, resonant frequency f is 7.3 MHz. When the spacing h between the transmitter antenna 1 and the receiver antenna 2 becomes 300 mm which is the same length as the diameters D of the antennas, coefficient of coupling k between the antennas becomes almost 0.02, and induced resistances r1 and r2 become almost 4Ω. Power transfer efficiency Pe in the matched circuit becomes almost 94%, thereby efficiently transferring the electric power.

The cause of the high power transfer efficiency Pe is that, when the antennas are enlarged, resonant frequency f becomes low, so that loss caused by skin effect in the wirings of the antennas becomes less. Thus, with large antennas, power can be efficiently transferred to the electric display device through the spacing h between the transmitter antenna 1 and the receiver antenna 2 even though the spacing h is great.

(Modification 6)

An inductive electric power transfer circuit according to modification 6 has large antennas of 300 mm in diameter, and supplies electric power to a vehicle which consumes the electric power. That is, the inductive electric power transfer circuit according to modification 6 has a power supply circuit 3 in a power supply facility which supplies electric power with electric current with frequency at almost 7.3 MHz. The current is led into the transmitter antenna 1 that is a three-turned coil of 300 mm square in diameter D, and with line of 10 mm in width. Electric power is transferred from the transmitter antenna 1 to the receiver antenna 2 in a vehicle facing the transmitter antenna 1 through spacing of 300 mm in the efficiency of almost 94%. The receiver antenna 2 transfers the power to a load circuit 4 such as a battery in the vehicle.

Eighth Embodiment

An inductive electric power transfer circuit according to an eighth embodiment transfers power to electronics facility such as a mobile phone without power lines; the circuit has a transmitter antenna 1 and a receiver antenna 2 placed in coplanar as shown in the plan view of FIG. 20(a). That is, the inductive electric power transfer circuit has 47 mm square antennas, which are a transmitter antenna 1 and a receiver antenna 2 separated by 20 mm and placed on a level. This inductive electric power transfer circuit works in the third type resonance of the principle of the present invention. Coefficient of coupling k between these antennas is 0.013. The transmitter antenna 1 and the receiver antenna 2 are coils which have seven-turned wirings in two parallel levels that are parallel to XY-plane and are separated each other by a gap of 1 mm, respectively. The shapes of the wirings in the two levels are formed so that their shadows projected into XY-pane are symmetric about Y-axis. Both ends of each antenna are free, and capacitances C1 and C2 are parasitic capacitances, which are represented by "min", between both ends of their antennas, respectively. A terminal of power supply circuit 3, port 1 (P1), is set in the middle of the transmitter antenna 1. A terminal of load circuit 4, port 2 (P2), is set in the middle of the receiver antenna 2.

When great capacitances are connected between both ends of the antennas, effective self-inductances L of the antennas are 8.9 µH. However, the effective inductances L of the antennas vary according to distribution of electric current on the antennas. When both ends of each antenna are free, effective inductance L of the antenna is less than that of the antenna with great capacitance between both ends of the antenna. The antennas resonate at frequency f=23.8 MHz. Parasitic capacitances which are represented by "min" between both ends of the antennas are almost 5 pF, which are calculated assuming that the antennas have self-inductances of 8.9 µH. When gap between the levels for the two wirings of the antenna is widen, the parasitic capacitance "min" becomes less.

Induced resistances r of the antennas in FIG. 20(a) are r=r1=r2=7Ω. Effective self-inductances L, which are used in approximate Equation 36, of the antennas are 3.6 µH, which is almost 40% of 8.9 µH of inductances of the antennas of which great capacitances are connected between both ends. The effective self-inductances of the antennas greatly change because the parasitic capacitance "min" between the two wirings that are facing each other in the antenna is too small to maintain the effective self-inductances of the antenna. FIG. 20(b) shows a graph for S21 of power transfer from the transmitter antenna 1 to the receiver antenna 2 as a function of frequency f. When impedances Z match with induced resistances r, power is transferred efficiently as S21 is −0.73 dB in which power transfer efficiency is almost 85%. Thus, there is enough power transfer efficiency even though the antennas are separated in coplanar as in FIG. 20(a) and the coefficient of coupling k of electromagnetic induction between antennas is small as 0.013. On the other hand, the power transfer efficiency Pe is calculated as Pe=0.85 using Equation 29 by substituting r1=7Ω and ref1=ref2=0.62Ω, where effective resistances ref1 and ref2 of the transmitter antenna 1 and the receiver antenna 2 are calculated accounting for skin effect. Thus, Equation 29 gives the result which agrees with the result given from electromagnetic field simulation. An inductive electric power transfer circuit according to the eighth embodiment has plural coiled receiver antennas 2 that are in coplanar, which are connected with respective electronic device, around a coiled transmitter antenna 1 on XY-plane. Therefore, the inductive power transfer circuit can supply power parallel to plural electronic devices through the receiver antennas. When the plural receiver antennas 2 are set up around the transmitter antenna 1, Z1/(2πfL1), which represents output impedance Z1 of the power supply circuit 3 connected in series with the transmitter antenna 1, is adjusted to the sum of the coefficients of coupling k for the plural receiver antennas 2, so that the output impedance Z is the sum of induced resistances r1 of the plural receiver antennas 2.

(Modification 7)

An inductive electric power transfer circuit according to modification 7 has antennas that have two seven-turned wirings on two parallel levels separated by 4 mm, respectively, which is four times the separation according to the eighth embodiment. This model resonates at 40.1 MHz as a result of electromagnetic field simulation. Parasitic capacitances "min" between both ends of the antennas are calculated as 2 pF, which are 40% of the parasitic capacitances in the eighth embodiment, by using effective self-inductances 8 µH that are given when both ends of the respective antennas are connected by great capacitances. Induced resistances of the antennas r are r=r1=r2=18Ω. When the impedances Z are matched with the induced resistances r, S21 for power transfer becomes −0.455 dB, so that power is transferred in the efficiency of almost 90%, which is better than the power transfer efficiency of the previous example. Effective self-inductances L of the antennas to use in approximate Equation 36 are 5.5 µH, which is almost 70% of 8 µH of the inductances of the antennas whose both ends are connected by great capacitances. Moreover, when spacing between the respective levels of the seven-turned wirings of the transmitter antenna 1 and the receiver antenna 2 become wider into 8 mm, the antennas resonate at 51.4 MHz, the induced resistances r become r=r1=r2=34Ω, and S21 becomes −0.32 dB, so that power is transferred in the efficiency of almost 93%.

(Modification 8)

An inductive electric power transfer circuit according to modification 8 has antennas which are one-layered seven-turned antennas which are half of the antennas in FIG. 20(a). The antennas are placed in coplanar alignment and separated 20 mm in distance as in FIG. 20(a).

A power supply circuit 3 has terminals of port 1 (P1) connecting in the middle of the wiring of the transmitter antenna 1 and a load circuit 4 has terminals of port 2 (P2) connecting in the middle of the wiring of the receiver antenna 2. These components compose a model for electromagnetic field simulation. The antennas according to modification 8 have self-inductances L of 2.3 µH and have parasitic capacitances "min" of 0.8 pF between both ends of the antennas, respectively. The antennas resonate at a frequency of 115 MHz. When the impedances Z of the circuits are matched to the induced resistances r concerned, the antennas in the alignment of FIG. 20(a) have the induced-resistances of r=r1=r2=14Ω. S21 of power transfer between the antennas is −0.49 dB and power is transferred in the efficiency of almost 89%.

Ninth Embodiment

An induced electric power transfer circuit according to a ninth embodiment has a transformer connected to a transmitter circuit 3b or a transformer connected to a receiver circuit 4b in FIG. 2(b) or has both transformers. The transformers have primary windings connected to terminals of ports in the antennas and secondary windings connected to terminals of the power supply circuit 3 or the load circuit 4. The induced electric power transfer circuit works in the third type resonance of the principle of the present invention. In addition, as shown in FIG. 21(a), the receiver antenna 2, which has capacitance C2 between both ends of the antenna, according to this embodiment works as the primary winding of the transformer. An inductive coupling wiring 6 is a secondary wiring of the transformer, whose both ends are connected to the load circuit 4 at port 4 (P4). Input impedance of the load circuit 4 is represented by the symbol Z4. The ninth embodiment is described by FIG. 21 as follows. FIG. 21(a) is a plan view of a transmitter antenna 1, a receiver antenna 2, and an inductive coupling wiring 6 according to the ninth embodiment. The plan view in FIG. 21(a) shows a transmitter antenna 1 and a receiver antenna 2 according to the ninth embodiment. The transmitter antenna 1 and the receiver antenna 2 have shapes shown in FIG. 20(*a*). They and the spiral inductive coupling wiring 6 are placed in coplanar on XY-plane. The spiral inductive coupling wiring 6 is set in the center of the spiral wiring of the receiver antenna 2. That is, the transmitter antenna 1 and the receiver antenna 2 in the inductive electric power transfer circuit is 47 mm in square. They are placed in coplanar on XY-plane and separated by 20 mm. The antennas are coupled with mutual inductance M. The receiver antenna encircles the looped inductive coupling wiring 6, which is copper wiring, 50 μm in thickness, 1 mm in line width, and is from 10 mm through 15 mm in diameter. Both ends of the inductive coupling wiring 6 are connected to the terminals at port 4 (P4) in the load circuit 4.

When the inductive coupling wiring 6 is a looped wiring of 10 mm in square and impedance Z4 of the load circuit 4 is 4Ω, electric power is most efficiently transferred from the power supply circuit 3 to the load circuit 4. On the other hand, when the size of the loop of the inductive coupling wiring 6 is enlarged into 15 mm in square; mutual inductance M2 between the inductive coupling wiring 6 and the receiver antenna 2 becomes greater, the impedance Z4 of the load circuit which matches to induced resistance r3 of the inductive coupling wiring 6 grows into 20Ω. FIG. 21(*b*) shows a graph for power transfer efficiency Pe, which is represented by S41, as a function of frequency when the inductive coupling wiring 6 has diameter of 10 mm to 15 mm. The graph shows power is transferred efficiently. FIG. 21(*a*) shows that self-inductance of the inductive coupling wiring 6 is less comparable with induced resistance r2=7Ω generated in the receiver antenna 2. Therefore, the input impedance Z4 of the load circuit 4, which is connected with the inductive coupling wiring 6 at port 4 (P4), is set as follows to transfer electric power most efficiently from the power supply circuit 3 to the load circuit. The adequate input impedance Z4 of the load circuit 4 is $(2\pi f \times M2)^2/r2 = (M2/M)^2 \times Z1$, where M2 is mutual inductance between the inductive coupling wiring 6 and the receiver antenna 2. The receiver antenna 2 can work as the inductive coupling wiring 6, and both ends of the receiver antenna 2 can be connected to the load circuit 4 at port 4 (P4). In that case, the power can be transferred most efficiently from power supply circuit 3 to load circuit 4 when Z4 is $(L2/M)^2 \times Z1$.

Moreover, the inductive electric power transfer circuit can have also a transmitter circuit 3*b* in the left of FIG. 2(*b*) for a combination of a transmitter antenna 1 and a power supply circuit 3; the transmitter circuit 3*b* has an inductive coupling wiring 6 that is inductively coupled with the transmitter antenna 1 by mutual inductance M1 and both ends of that are connected to the power supply circuit 3 at port 3 (P3). On the other hand, a receiver circuit 4*a* in the right of FIG. 1(*a*) is used for receiver antenna 2. In that case, the output impedance Z3 of the power supply circuit 3 is converted into an induced resistance r2 seen from the load circuit 4 at port 2 (P2) in the receiver antenna 2, the induced resistance r2 becomes almost $(M/M1)^2 \times Z3$.

Moreover, the inductive coupling wiring 6 also can work as a transmitter antenna 1. In that case, the output impedance Z3 of the power supply circuit 3 is converted into an induced resistance r2 seen from the load circuit 4 at port 2 (P2) in the receiver antenna 2, the induced resistance r2 becomes almost $(M/L1)^2 \times Z3$.

Tenth Embodiment

An inductive electric power transfer circuit according to a tenth embodiment is an impedance converter 5 that has air-core coil and works in the first type resonance of the principle of the present invention. That is, it is a circuit of FIG. 2(*a*) in which $L1 \times C1 = L2 \times C2 = 1/\omega o^2$ and angular frequency ω of the current transferring power is ω0; when output impedance Z1 of a power supply circuit 3, which is connected in series with a transmitter antenna 1 at port 1 (P1), is set to r1=αωM, input impedance Z2 of a load circuit 4, which is connected in series with a receiver antenna 2 at port 2 (P2), becomes r2=ωM/α, where α is arbitrary positive parameter. Thus, the inductive electric power transfer circuit to convert impedance and transfer power from the power supply circuit 3 to the load circuit 4 can be composed. That is, an impedance converter 5 is composed, which can arbitrarily change ratio between impedances of the power supply circuit 3 and the load circuit 4 keeping constant product of both impedances.

The impedance converter 5 according to the tenth embodiment has the same function as impedance converter with transmission line of quarter wavelength of the electromagnetic field. Although an impedance converter with transmission line of quarter wavelength should form the length of the wiring for the transmission line, the impedance converter 5 according to the tenth embodiment can be smaller than quarter wavelength of the electromagnetic field by connecting capacitances C1 and C2 between both ends of the transmitter antenna 1 and the receiver antenna 2, respectively. Moreover, an impedance converter consisting of quarter-wavelength transmission line is difficult to use because the converter converts impedance from Zo×α to Zo/α, where Zo, which is characteristic impedance of the transmission line, is fixed basic impedance for impedance conversion, though α is arbitrary changeable positive parameter. On the other hand, the impedance converter 5 according to the tenth embodiment is easy to use because the converter uses changeable basic impedance ωM for impedance conversion, where M is mutual inductance changeable by changing distance between the transmission antenna 1 and the receiver antenna 2.

In the tenth embodiment, induced resistance r2 is generated on the coiled receiver antenna 2 by the electromagnetic field generated from the transmitter antenna 1. Electric power can be efficiently transferred to the receiver antenna 2 by connecting load circuit 4 with input impedance matched with the induced resistance r2. Induced voltage on the receiver antenna 2 is proportional to the magnetic field in the area of the receiver antenna 2 caused by transmitter antenna 1. When the magnetic field is reduced, the induced voltage on the receiver antenna 2 is reduced. In that case, when input impedance of the load circuit 4, which is connected with the receiver antenna 2, decreases electric current I2, which is on the receiver antenna 2, increases and the receiver antenna 2 receives greater electric power. When conductor loss of the receiver antenna 2 decreases, the current I2 on the receiver antenna 2 increases to the extent that power transfer efficiency from the transmitter antenna 1 to the receiver antenna 2 is almost 100%. When the current I2 increases on the receiver antenna 2, induced resistance r1, which is caused by the current I2, on the transmitter antenna 1 increases to force the transmitter antenna 1 supply more power. Thus, power can be transferred with almost 100% efficiency from the power supply circuit 3, which is connected to the transmitter antenna 1, to the load circuit 4, which is connected to the receiver antenna 2.

An inductive electric power transfer circuit can be used where coefficient of coupling k between the transmitter antenna 1 and the receiver antenna 2 is not limited to greater than 0.004. For instance, the coefficient of coupling k between those antennas becomes smaller than 0.004 for the inductive electric power transfer circuit that transfers power from the transmitter antenna 1 that is out of human body to the receiver antenna 2 in a capsular endoscope that is taken in a human body. Then, the mutual inductance M between the antennas becomes small according to Equation 23, thereby reducing the induced resistances r1 and r2 according to Equations 33 and 34. Then, there is a problem that power transfer efficiency Pe, which is according to Equation 29, becomes worse. In spite of that, the inductive electric power transfer circuit can transfer power efficiently when it is set as follows. That is, the current I1 on the transmitter antenna 1 is enlarged more than the current I2 on the receiver antenna 2 to reduce the electric current ratio parameter α; the induced resistance r2 on the receiver antenna 2, which is calculated using Equation 34, becomes greater than effective resistance ref2 of the receiver antenna 2, so that power transfer efficiency Pe, which is calculated using Equation 29, is enlarged. Effective resistance ref1 of the transmitter antenna 1, which is out of human body, can be smaller than induced resistance r1 by forming the antenna 1 with superconductor. With these methods, the inductive electric power transfer circuit can have high power transfer efficiency Pe, which is calculated using Equation 29.

(Modification 9)

An inductive electric power transfer circuit according to a transferred example 9 has a combination of a load circuit 4 and a receiver antenna 2, combination which is a receiver circuit 4b of the right side of FIG. 2(b), so that the receiver antenna 2 is inductively coupled with a inductive coupling wiring 6 with mutual inductance M, and both ends of the inductive coupling wiring 6 are connected to a load circuit 4 at port 4. As shown precisely in FIG. 21(a), the inductive coupling wiring 6 is inductively coupled with the receiver antenna 2, and both ends of the inductive coupling wiring 6 are connected to the load circuit 4 at port 4 (P4). On the other hand, the combination of a power supply circuit 3 and a transmitter antenna 1 is composed of a transmitter circuit 3a, which is a series circuit, in the left of FIG. 2(a). The input impedance of the load circuit 4 that is connected at port 4 is represented by the symbol Z4. Output impedance Z1 of a power supply circuit 3 according to modification 9 is converted into induced resistance of almost $(M2/M)^2 \times Z1$ that is observed by the load circuit 4. Power can be most efficiently transferred to the load circuit 4 when the induced resistance is matched with input impedance Z4 of the load circuit 4. Additionally, the receiver antenna 2, which has effective self-inductance L2, can combine with the inductive coupling wiring 6 as shown in a receiver circuit 4c of the left of FIG. 2(c), and the load circuit 4 and a capacitance C2 can be connected in parallel between both ends of the receiver antenna 2 at port 6. In that case, output impedance Z1 of the power supply circuit 3 is converted into induced resistance of almost $(L2/M)^2 \times Z1$ that is observed by the load circuit 4 at port 4. Power can be most efficiently transferred to the load circuit 4 when the induced resistance is matched with input impedance Z4 of the load circuit 4.

(Modification 10)

An inductive electric power transfer circuit according to a modification 10 has a combination of a transmitter antenna 1 and a power supply circuit 3 which is similar to the combination of a receiver antenna 2 and a load circuit 4 that is composed as FIG. 21(a), which is composed of a transmitter antenna 1 and a inductive coupling wiring 6 that is inductively coupled with the transmitter antenna 1 and a power supply circuit 3 that is connected between both ends of the inductive coupling wiring 6. The combination of a transmitter antenna 1 and a power supply circuit according to modification 10 is a transmitter circuit 3b in the left of FIG. 2(b), where the inductive coupling wiring 6 is inductively coupled with the transmitter antenna 1 with mutual inductance M1, and both ends of the inductive coupling wiring 6 are connected to the power supply circuit at port 3 (P3). Output impedance of the power supply circuit 3 is represented by the symbol Z3. A combination of a receiver antenna 2 and a load circuit 4 is a series circuit of receiver circuit 4a in the right of FIG. 2(a). The composition according to modification 10 converts output impedance Z3 of the power supply circuit 3 into induced resistance $r2=(M/M1)^2 \times Z3$ seen from the load circuit 4. When input impedance Z2 of the load circuit 4 is matched to the induced resistance r2, power can be transferred most efficiently. On the other hand, an inductive electric power transfer circuit can have a transmitter antenna 1, with effective self-inductance L1, that combines with a inductive coupling wiring 6, the transmitter antenna 1 is in a transmitter circuit 3c in the left of FIG. 2(c), where a power supply circuit 3 and a capacitance C1 are connected in parallel between both ends of the transmitter antenna 1 at port 5. In that case, the output impedance Z3 of the power supply circuit 3 is converted into induced resistance $r2=(M/L1)^2 \times Z3$ seen from the load circuit 4. When the input impedance Z2 of the load circuit 4 is matched to the induced resistance r2, power can be transferred most efficiently.

Eleventh Embodiment

An inductive electric power transfer circuit according to an eleventh embodiment uses the impedance converter 5 in the tenth embodiment to adapt changes of impedance when distance between a transmitter antenna 1 and a receiver antenna 2 changes. FIG. 22(b) shows a plan view of the inductive electric power transfer circuit according to the eleventh embodiment. Although FIG. 22(b) shows the case when the inductance L1 of the coiled transmitter antenna 1 is the same as the inductance L2 of the coiled receiver antenna 2 as L=L1=L2, this embodiment can be applied to the case when their impedances are different each other. FIG. 22(a) shows a plan view of an inductive electric power transfer circuit composed of a transmitter antenna 1 and a receiver antenna 2 without the impedance converter 5. Mo is defined as mutual inductance M between a transmitter antenna 1 and a receiver antenna 2 when inductive coupling coefficient k between them is k0. In that case in which the antennas resonate at angular frequency $\omega=\omega o=1/\sqrt{(L1 \cdot C1)}$, when output impedance Z1 of the power supply circuit 3 and the input impedance Z2 of the load circuit 4 are matched to ωMo according to Equations 30 and 31, power can be transferred in full efficiency.

The circuit in FIG. 22(b) is described as follows. FIG. 22(b) shows an inductive electric power transfer circuit in which distance between a transmitter antenna 1 and a receiver antenna 2 changes and coefficient of coupling k between both antennas changes; the change is compensated by the impedance converter 5 of the tenth embodiment, which is inserted between a power supply circuit 3 and a transmitter antenna 1 at port 1 (P1). That is, the power supply circuit 3, which has fixed output impedance Z1=ωoMo, is connected to an input terminal that is in the middle of a transmitter antenna in the impedance converter 5; an output terminal that is in the middle of a receiver antenna in the impedance converter 5 is connected to port 1 (P1) that is in the middle of the transmitter antenna 1. This impedance converter 5 changes distance between its transmitter antenna and receiver antenna, or changes distance between the coil axes of both antennas; so that mutual inductance between both antennas can be adjusted freely. When placement of the transmitter antenna 1 and the receiver antenna 2 changes and the distance between the antennas becomes greater, coefficient of coupling k between the transmitter antenna 1 and the receiver antenna 2 becomes less and mutual inductance M becomes less. It is assumed that the mutual inductance M becomes small as Mo/γ, where γ is a real number parameter that is greater than one. In this case, input impedance Z2, which is fixed to ωMo, of the load circuit 4 that is connected to the receiver antenna 2 at port 2(P2) is converted into impedance $Z5=\omega Mo/\gamma^2$ at port 1 (P1) seen from the transmitter antenna 1. For this reason, the impedance converter 5 needs to convert the output impedance Z1, which is fixed to ωMo, of the power supply circuit 3 into impedance $Z5=\omega Mo/\gamma^2$ at port 1 (P1) seen from the transmitter antenna 1. To achieve this, the impedance converter 5 changes mutual inductance between its transmitter antenna and receiver antenna into Mo/γ by changing coefficient of coupling k between them by changing distance between them. As a result, the impedance from the power supply circuit 3 is converted into the impedance that matches the impedance converted from the load circuit 4 at port 1 (P1).

Thus, power can be transferred in full efficiency by matching the impedances from the power supply circuit 3 that has fixed output impedance Z1 through the load circuit 4 that has fixed input impedance Z2 by the impedance converter that compensates the change of the mutual inductance between the transmitter antenna 1 and the receiver antenna 2, in which the change is caused by change of their placement. As described above, the impedance converter 5 compensates the change of the impedance by matching impedance when mutual impedance M between the transmitter antenna 1 and the receiver antenna 2 changes, by converting the impedance properly and keeping resonant angular frequency ω to ωo, and by adjusting just one parameter of distance between antennas to change the mutual inductance between them in the converter 5. An inductive electric power transfer circuit according to this embodiment has merits that it is simple since it keeps resonance frequency constant, and it is easy to adjust impedance since it needs only one parameter for the adjustment.

Twelfth Embodiment

FIG. 23(a) shows an inductive electric power transfer circuit according to a twelfth embodiment. The circuit has a receiver antenna 2 whose diameter G is one-sixth of diameter D of a transmitter antenna 1. The receiver antenna 2 is placed in coplanar with, and in the middle of, the transmitter antenna 1 on XY-plane. The transmitter antenna 1 is a one-turn loop of 300 mm square in diameter D, 1 mm in line width. This inductive electric power transfer circuit works in the third type resonance of the principle of the present invention. The receiver antenna 2 is 47 mm in diameter G, and has two seven-turned spiral wirings which are faced each other on two levels. The spiral wirings are connected at port 2 (P2) as in FIG. 20(a) of the eighth embodiment. Distance between the levels along the direction vertical to XY-plane is 1 mm. A capacitance C1 of 116 pF that is a capacitor (capacitance device) is connected between both ends of the transmitter antenna 1. A capacitance C2 that is a capacitor (capacitance device) of 15.6 pF and parasitic capacitance of 5.2 pF is connected between the ends of the receiver antenna 2. Self-inductance L1 of the transmitter antenna 1 is 1.5 μH, and effective self-inductance L2 of the receiver antenna 2 is 8.9 μH. The transmitter antenna 1 and the receiver antenna 2 of the inductive electric power transfer circuit resonates at 12 MHz where angular frequency ω is equal to ωo, which is the first type resonance of the principle of the present invention. The transmitter antenna 1 has an induced resistance r1 of 3.3Ω, which is matched with output impedance of the power supply circuit 3 to transfer power. The receiver antenna 2 has an induced resistance r2 of 4.3Ω, which is matched with input impedance of the load circuit 4 to transfer power. However, these induced resistances r1 and r2 can change according to Equations 33 and 34 depending on ratio of resonant current I1 on the transmitter antenna 1 and resonant current I2 on the receiver antenna 2 in the condition of keeping product of r1 and r2 constant. Coefficient of coupling k between the transmitter antenna 1 and the receiver antenna 2 is calculated as $k=\sqrt{(r1 \cdot r2/(L1 \cdot L2))}/(2\pi f)=0.014$ by using the induced resistances obtained from simulation.

FIG. 23(b) shows a graph for power transfer efficiency Pe, which is represented by S21 from the transmitter antenna 1 to the receiver antenna 2, as a function of frequency. S21 is −1.33 dB at a frequency of 12 MHz. This means that power transfer efficiency Pe is almost 74%, efficiently. Thus, the inductive electric power transfer circuit can transfer power efficiently although the receiver antenna 2 has the diameter of one-sixth of the diameter of the transmitter antenna 1. As described in the first embodiment, difference between resonant frequencies of both antennas, which is due to difference of characteristics of parts in the inductive electric power transfer circuit, can be within the extent that is effective to transfer power without obstacle when the coefficient of coupling k between the transmitter antenna 1 and the receiver antenna 2 is adjusted to 0.04 or more. Power can be transferred efficiently by making the ratio of diameter of the antennas within 12 times, since coefficient of coupling k between the antennas is almost 0.04 when the diameter G of the receiver antenna 2 is almost one-twelfth of the diameter D of the transmitter antenna 1. Power can be transferred without obstacle practically like the modifications 2 and 4 of the first embodiment when the distance between the centers of the coils that are the receiver antenna 2 and the transmitter antenna 1 is within twice the diameter of the larger antenna.

Thirteenth Embodiment

An inductive electric power transfer circuit according to a thirteenth embodiment has an antenna that receives electromagnetic wave from the air, the antenna is substituted for a combination of a power supply circuit and a transmitter antenna 1; or the circuit has an antenna that radiates electromagnetic wave into the air, the antenna is substituted for a combination of a load circuit and a receiver antenna 2. The circuit according to this embodiment works in the first type resonance of the principle of the present invention. The inductive electric power transfer circuit in FIG. 24(a) has a copper dipole antenna of 1 mm in width, 940 mm in length along the direction of X-axis, on XY plane, which is a transmitter antenna 1 and an antenna that receives electromagnetic wave from the air and converts it into electric power. The function that receives electromagnetic wave and converts it into electric power is substituted for a power supply circuit 3. A receiver antenna 2 in FIG. 24(a) is a coiled copper wiring antenna with diameter G=54 mm in square that is formed on a polyimide film. Spacing h between the levels of the receiver antenna 2 and the level of the transmitter antenna 1, which is on XY-plane, is 10 mm. The receiver antenna 2 is separated from the transmitter antenna 1 by 1 mm along the direction of Y-axis. The receiver antenna 2 is a three-turned coil that has a wiring with free ends without external capacitor between the ends and has port 2 (P2) in the middle of the wiring coil as the wiring coil in FIG. 14 according to the third embodiment. The inductive electric power transfer circuit has current I1 on the transmitter antenna 1 and current I2 on the receiver antenna 2, their phase is different by 90 degrees, the resonant angular frequency ω is ωo. The antennas resonate at a frequency of 154 MHz according to Equations 33 through 35, where cos(β) is zero. In one case, induced resistances r1 and r2 on the transmitter antenna 1 and the receiver antenna 2 are 30Ω. The induced resistances r1 and r2 change depending on the ratio of the current I1 on the transmitter antenna 1 and the current I2 on the receiver antenna 2 according to Equations 33 and 34, and product of r1 and r2 is kept constant. The induced resistance r1 is equated with radiation resistance of the transmitter antenna 1 since the radiation resistance is regarded as output impedance Z1 of a function of a power supply circuit 3 generated on the antenna. The induced resistance r2 is settled according to the resistance r1. Then, the input impedance Z2 of load circuit 4 is adjusted to the resistance r2. Thus, for power transfer, the induced resistances r1 and r2 are matched with the output impedance Z1 of the power supply circuit 3 and the input impedance Z2 of the load circuit 4.

FIG. 24(b) shows a graph for power transfer efficiency Pe, which is represented by S21, from the transmitter antenna 1 to the receiver antenna 2 as a function of frequency. At 154 MHz of a resonant frequency f, power transfer efficiency Pe is almost 76% which is −1.21 dB in S21. Thus, the inductive electric power transfer circuit, which has the dipole antenna of the transmitter antenna 1 and the coil of the receiver antenna 2, can transfer power in good efficiency. For a modification, the width of the antenna wiring of the dipole antenna of the transmitter antenna 1 is widen nine times into almost 10 mm, so that effective resistance ref1 of the antenna wiring becomes one-ninth. Effective resistance ref2 of the antenna wiring of the receiver antenna 2 is not changed. The current I1 on the transmitter antenna 1 is set to three times the current I2 on the receiver antenna 2, so that the ratio α between electric currents in Equations 33 and 34 becomes one-third, r1 becomes one-third, and r2 becomes triples.

Then, power transfer efficiency Pe according to Equation 29 rises, and loss rate of power that is (1 minus Pe) decreases into almost one-third. In the example where spacing h between the levels of the transmitter antenna 1 and the receiver antenna 2 is 2 mm which is reduced to one-fifth the former spacing, then, power transfer efficiency Pe according to the embodiment can be almost 86%, the induced resistances are r 1=r2=40Ω, and S21 is −0.63 dB. The inductive electric power transfer circuit according to the embodiment has the dipole antenna that receives electromagnetic wave from the air and supplies its power to the circuit; the antenna is substituted for a combination of a power supply circuit 3 and a transmitter antenna 1. The circuit transfers power as efficiently as the former embodiments.

For another modification, an inductive electric power transfer circuit is constructed where the combination of a transmitter antenna 1 and a power supply circuit 3 is exchanged for the combination of a receiver circuit 2 and a load circuit 4. That is, the inductive electric power transfer circuit has a dipole antenna as a combination of a receiver antenna 2 and a load circuit 4, the dipole antenna radiates electromagnetic wave into the air to consume power as a function of a load circuit 4.

For another example, the antenna system according to the embodiment can reduce the size by one digit having metal patterns on a flexible substrate such as a polyimide film. The system has a dipole antenna or a spiral dipole antenna that receives electromagnetic wave from the air as a combination of a power supply circuit 3 and a transmitter antenna 1. The system has a receiver antenna 2 close to the transmitter antenna 1. The receiver antenna 2 is a three-turned metal spiral of 5 mm in square on a resin, or ceramic, substrate of 6 mm in square. And both ends of the receiver antenna 2 are free. The inductive electric power transfer circuit has the receiver circuit 4 in an IC-chip connected, in series with, in the middle of the receiver antenna 2 at port 2 (P2). Since the antennas are reduced in size by one digit, resonant frequency becomes almost 1.5 GHz. However, the induced resistance r is almost the same as that in the former example. For another example, the resonant frequency can be reduced by increasing the number of turns of the antennas or connecting an external capacitor of great capacitance between both ends of the antennas.

INDUSTRIAL APPLICABILITY

The inductive electric power transfer circuits according to the present invention are applicable for supplying power through space from power supply facilities to vehicles etc. Moreover, they are applicable for supplying power through a wall of houses to display units etc. Moreover, they are applicable for supplying power to in vivo electronic devices buried in human body through skin without power lines. Moreover, they are applicable for transferring power between tracing layers in semiconductor integrated circuits without power lines. Moreover, they are applicable for transferring power between an antenna and an electronic device through space; the antenna receives or radiates electromagnetic wave from or into the air; the antenna has a function of a power supply circuit and transmitter antenna, or a function of a load circuit and a receiver circuit.

What is claimed is:

1. An inductive electric power transfer circuit, comprising:
a transmitter antenna connected with a series power supply circuit that supply electric power at angular frequency (ω);
a receiver antenna connected with a series load circuit that consumes the electric power;
capacitance (C1) which is connected between both ends of the transmitter antenna; and
capacitance (C2) which is connected between both ends of the receiver antenna;
wherein distance between the transmitter antenna and the receiver antenna is not greater than $1/2\pi$ wavelengths of electromagnetic field at the angular frequency (ω) the transmitter antenna has effective self-inductance (L1), and the receiver antenna has effective self-inductance (L2), the magnetic coefficient of coupling of electromagnetic induction between the transmitter antenna and the receiver antenna is represented by the symbol k, and wherein with a phase angle (β) that is not less than zero and not greater than pi, the angular frequency (ω) is reciprocal of square root of $L2 \times C2 \times (1+k \times \cos(\beta))$, the power supply circuit has output impedance of $k\omega L1 \times \sin(\beta) = r1$, and the load circuit has input impedance of $k\omega L2 \times \sin(\beta) = r2$, power is transferred from the power supply circuit to the load circuit through space.

2. The inductive electric power transfer circuit according to claim 1,
wherein the combination of the transmitter antenna and the power supply circuit is replaced with a combination of a second transmitter antenna and a first inductive coupling wiring and a second power supply circuit, both ends of the first inductive coupling wiring are connected with the second power supply circuit, mutual inductance between the second transmitter antenna and the first inductive coupling wiring are represented by the symbol M1, and output impedance of the second power supply circuit is $(\omega \times M1)^2/r1$.

3. The inductive electric power transfer circuit according to claim 2,
wherein the second transmitter antenna is combined with the first inductive coupling wiring, and output impedance of the second power supply circuit is $(\omega \times L1)^2/r1$.

4. The inductive electric power transfer circuit according to claim 1,
wherein the combination of the receiver antenna and the load circuit is replaced with a combination of a second receiver antenna and a second inductive coupling wiring and a second load circuit, both ends of the second inductive coupling wiring are connected with the second load circuit, mutual inductance between the second receiver antenna and the second inductive coupling wiring is represented by the symbol M2, and input impedance of the second load circuit is $(\omega \times M2)^2/r2$.

5. The inductive electric power transfer circuit according to claim 4,
wherein the second receiver antenna is combined with the second inductive coupling wiring, and input impedance of the second load circuit is $(\omega \times L2)^2/r2$.

6. The inductive electric power transfer circuit according to claim 1,
wherein the combination of the transmitter antenna and the capacitance (C1) and the power supply circuit is replaced with an antenna that receives electromagnetic waves from the air.

7. The inductive electric power transfer circuit according to claim 1,
wherein the combination of the receiver antenna and the capacitance (C2) and the load circuit is replaced with an antenna that radiates electromagnetic waves into the air.

8. An inductive electric power transfer circuit, comprising:
a transmitter antenna connected with a series power supply circuit that supply electric power at angular frequency ($\omega$);
a receiver antenna connected with a series load circuit that consumes the electric power;
capacitance (C1) which is connected between both ends of the transmitter antenna; and
capacitance (C2) which is connected between both ends of the receiver antenna;
wherein distance between the transmitter antenna and the receiver antenna is not greater than $1/2\pi$ wavelengths of electromagnetic field at the angular frequency ($\omega$), the transmitter antenna has effective self-inductance (L1), the receiver antenna has effective self-inductance (L2), the mutual inductance between the transmitter antenna and the receiver antenna is represented by the symbol M, and output impedance of the power supply circuit is represented by the symbol Z1, and wherein the angular frequency ($\omega$) is reciprocal of square root of L2×C2, and the load circuit has input impedance of $(\omega M)^2/Z1$ power is transferred from the power supply circuit to the load circuit through space.

9. The inductive electric power transfer circuit according to claim 8,
wherein the combination of the transmitter antenna and the power supply circuit is replaced with a combination of a second transmitter antenna and a first inductive coupling wiring and a second power supply circuit, both ends of the first inductive coupling wiring are connected with the second power supply circuit, mutual inductance between the second transmitter antenna and the first inductive coupling wiring are represented by the symbol M1, output impedance of the second power supply circuit is represented by the symbol Z3, and input impedance of the load circuit is $(M/M1)^2 Z3$.

10. The inductive electric power transfer circuit according to claim 9, wherein the second transmitter antenna is combined with the first inductive coupling wiring, and input impedance of the load circuit is $(M/L1)^2 Z3$.

11. The inductive electric power transfer circuit according to claim 8,
wherein the combination of the receiver antenna and the load circuit is replaced with a combination of a second receiver antenna and a second inductive coupling wiring and a second load circuit, both ends of the second inductive coupling wiring are connected with the second load circuit, mutual inductance between the second receiver antenna and the second inductive coupling wiring are represented by the symbol M2, and input impedance of the second load circuit is $(M2/M)^2 Z1$.

12. The inductive electric power transfer circuit according to claim 11,
wherein the second receiver antenna is combined with the second inductive coupling wiring, and input impedance of the second load circuit is $(L2/M)^2 Z1$.

* * * * *

UNITED STATES PATENT AND TRADEMARK OFFICE
CERTIFICATE OF CORRECTION

PATENT NO.       : 8,610,312 B2
APPLICATION NO.  : 12/677976
DATED            : December 17, 2013
INVENTOR(S)      : Hideo Kikuchi It is certified that error appears in the above-identified patent and that said Letters Patent is hereby corrected as shown below:

In the Specification

Column 3, line 27 please replace "L2×C2×(l+k×cos(6))" with - 2×C2×(1+k×cos(β)) -

Column 3, line 29 please replace "sin(β) r1" with - sin(β) ≡r1 -

Column 3, line 30 please replace "sin(β) r2" with - sin(β) ≡r2 -

Column 3, line 52 please replace "1/ω)2L" with - 1/(ω2L) -

Column 9, line 48 please replace "I2/I1 ≡ α · exp(-jα)" with - I2/I1 ≡ α · exp(-jβ) -

Column 11, line 41 please replace "6" with - ω -

Column 11, line 65 please replace equation 17 "α² = ω g1/g2" with - α²=g1/g2 -

Column 12, line 3 please replace "δ" with - β -

Column 12, line 7 please replace "6" with - ω -

Column 12, line 15 please replace "g=g2=0" with - g1=g2=0 -

Column 12, line 65 please replace "L×C1=L2×C2= 1/ωo²" with - L1×C1=L2×C2= 1/ωo² -

Column 12, line 67 please replace "L×C1×(1+k×cos(β))" with - L1×C1×(1+k×cos(β)) -

Column 13, line 1 please replace "δ" with - β -

Column 13, line 4 please replace "r=kωL1×sin(β)" with - r1=kωL1×sin(β) -

Column 13, line 41 please replace "δ" with - β -

Column 14, line 43 please replace "δ" with - β -

Signed and Sealed this
Twenty-seventh Day of May, 2014

Michelle K. Lee
*Deputy Director of the United States Patent and Trademark Office*

CERTIFICATE OF CORRECTION (continued)
U.S. Pat. No. 8,610,312 B2

Column 16, line 20 please replace "Ω" with - 4Ω -

Column 16, line 21 please replace "Ω" with - 4Ω -

Column 17, line 11 please replace "Ω" with - 20Ω -

Column 17, line 12 please replace "Ω" with - 23Ω -

Column 17, line 20 please replace "(2n)" with - (2π) -

Column 17, line 25 please replace "(2n)" with - (2π) -

Column 17, line 47 please replace "(c)" with - 3(c) -

Column 17, line 65 please replace "r/(2πfL1)" with - r1/(2πfL1) -

Column 17, line 67 please replace "r/(2πfL2)" with - r2/(2πfL2) -

Column 20, line 40 please replace "L=L2=L=176 nH" with - L1=L2=L=176nH -

Column 21, line 5 please add a - 2 - between "modification" and "as"

Column 23, line 53 please replace "6" with - ω -

Column 24, line 4 please replace "δ" with - β -

Column 28, line 20 please replace "6" with - β -

In the Claims

Column 40, claim 1, line 43 please add - , - between "(ω)" and "the"